United States Patent [19]

Furutani

[11] Patent Number: 5,610,550
[45] Date of Patent: Mar. 11, 1997

[54] INTERMEDIATE POTENTIAL GENERATOR STABLY PROVIDING AN INTERNAL VOLTAGE PRECISELY HELD AT A PREDETERMINDED INTERMEDIATE POTENTIAL LEVEL WITH REDUCED CURRENT CONSUMPTION

[75] Inventor: Kiyohiro Furutani, Hyogo, Japan

[73] Assignee: Mitsubishi Denki Kabushiki Kaisha, Tokyo, Japan

[21] Appl. No.: 190,329

[22] Filed: Jan. 31, 1994

[30] Foreign Application Priority Data

Jan. 29, 1993 [JP] Japan .................................. 5-013650

[51] Int. Cl.$^6$ ............................. G05F 3/20; G05F 3/16
[52] U.S. Cl. ..................... 327/543; 327/542; 327/541; 327/566; 327/108; 323/313; 323/314; 257/371
[58] Field of Search ............................ 327/543, 541, 327/538, 542, 566, 108, 112; 323/313, 312, 314; 257/371, 372

[56] References Cited

U.S. PATENT DOCUMENTS

| | | | |
|---|---|---|---|
| Re. 34,290 | 6/1993 | Tobita | 323/313 |
| 4,122,481 | 10/1978 | Horie | 357/43 |
| 4,663,584 | 5/1987 | Okada et al. | 327/537 |
| 4,670,706 | 6/1987 | Tobita . | |
| 4,788,455 | 11/1988 | Mori et al. | 323/314 |
| 4,817,055 | 3/1989 | Arakawa et al. | 327/543 |
| 4,833,342 | 5/1989 | Kiryu et al. | 327/541 |
| 5,008,609 | 4/1991 | Fukiage | 323/313 |
| 5,136,182 | 8/1992 | Fawal | 327/541 |
| 5,212,440 | 5/1993 | Waller | 327/537 |
| 5,260,646 | 11/1993 | Ong | 327/530 |
| 5,369,354 | 11/1994 | Mori | 323/313 |
| 5,384,474 | 1/1995 | Park et al. | 257/304 |

FOREIGN PATENT DOCUMENTS 60-103827  6/1985  Japan .
63-174115  7/1988  Japan .

OTHER PUBLICATIONS

"Microelectronics: Digital and Analog Circuits and Systems", Jacob Millman, Ph.D., Microelectronics, 1979, pp. 402–405.
An Experimentally 1.5–V 64–Mb DRAM, IEEE Journal of Solid–State Circuits, vol. 26, No. 4, Apr. 1991, pp. 465–470.
A 38–ns 4–Mb DRAM With a Battery–Backup (BBU) Mode, Konishi et al., IEEE Journal of Solid–State Circuits, vol. 25, No. 5, Oct. 1990, pp. 1112–1116.

*Primary Examiner*—Timothy P. Callahan
*Assistant Examiner*—Terry L. Englund
*Attorney, Agent, or Firm*—Lowe, Price, LeBlanc & Becker

[57] ABSTRACT

A first circuit and a second circuit having the same voltage-current characteristics are connected in series between a power supply potential node and a ground potential node. Each of the first and second circuits includes as a load element a MOS transistor formed on a semiconductor substrate having a triple-well structure. A first reference potential is provided from the first circuit. A third circuit and a fourth circuit having the same voltage-current characteristics are connected in series between the power supply potential node and the ground potential node. Each of the third and fourth circuits includes as a load element a MOS transistor formed on the semiconductor substrate having the triple-well structure. A second reference potential is provided from the third circuit. The first reference potential is applied to the gate of an n-channel MOS transistor connected between the power supply potential node and an output node. The second reference potential is applied to the gate of a p-channel MOS transistor connected between an output node and the ground potential node. An intermediate potential between the power supply potential and the ground potential is provided from the output node. An auxiliary drive circuit operatively coupled to the output node provides increased current driving capability for driving the output node to the intermediate potential.

28 Claims, 16 Drawing Sheets

INTERMEDIATE POTENTIAL GENERATOR STABLY PROVIDING AN INTERNAL VOLTAGE PRECISELY HELD AT A PREDETERMINED INTERMEDIATE POTENTIAL LEVEL WITH REDUCED CURRENT CONSUMPTION

BACKGROUND OF THE INVENTION

1. Field of the Invention

The present invention relates to intermediate potential generators, and particularly to a device for generating an intermediate potential between an operating power supply potential Vcc and a ground potential GND. More particularly, the present invention relates to a device for generating an intermediate potential for precharging a bit line, an internal data bus line, and a cell plate of a memory cell capacitor in a dynamic random access memory.

2. Description of the Background Art

FIG. 15 is a schematic diagram showing the structure of a conventional intermediate potential generator. The intermediate potential generator shown in FIG. 15 is described, for example, in IEEE, *Journal of Solid-State Circuits*, Vol. 26, No. 4, April 1991, pp. 465–470.

Referring to FIG. 15, the intermediate potential generator includes a reference potential generating stage 30 generating a first reference potential (½) Vcc+Vtna and a second reference potential (½) Vcc−|Vtpa|, and a drive stage 40 receiving the first and second reference potentials from reference potential generating stage 30 to provide an intermediate potential (½) Vcc to an output node 50. Both the reference potential generating stage 30 and drive stage 40 are driven by a power supply potential Vcc and a ground potential GND respectively provided from a power supply potential node 10 and a ground potential node 20.

Reference potential generating stage 30 includes a voltage dividing stage and a bias stage. The voltage dividing stage includes a resistance element 31 formed of e.g. polysilicon, and connected between power supply potential node 10 and an internal node 32, and a resistance element 33 formed of e.g. polysilicon, and connected between node 32 and ground potential node 20. Resistance elements 31 and 33 are formed of identical material, and have an identical resistance value. A potential of node 32, therefore, is Vcc/2.

The bias stage includes a resistance element 34 connected between power supply potential node 10 and a first internal output node 35, and an n-channel MOS transistor 36 connected between nodes 35 and 32 and having its gate connected to node 35. Resistance element 34 has a high resistance value not less than 1 MΩ. Transistor 36 has a threshold voltage Vtna.

The bias stage further includes a p-channel MOS transistor 37 connected between node 32 and an internal output node 38 and having its gate connected to output node 38, and a resistance element 39 formed of e.g. polysilicon, and connected between node 38 and ground potential node 20. Transistor 37 has a negative threshold voltage Vtpa. Resistance element 39 has a high resistance value not less than 1 MΩ as resistance element 34 has.

Drive stage 40 includes a push-pull current-mirror amplifying stage and a push-pull output stage. The push-pull current-mirror amplifying stage includes a p-channel MOS transistor 40a connected between power supply potential node 10 and a node 40b and having its gate connected to a node 40b; an n-channel MOS transistor 40c connected between node 40b and an output node 50, and receiving at its gate the first reference potential generated from internal output node 35 of reference potential generating stage 30; a p-channel MOS transistor 40d connected between output node 50 and a node 40e, and receiving at its gate the second reference potential from internal output node 38 of the reference potential generating stage; and an n-channel MOS transistor 40f connected between node 40e and ground potential node 20, and having its gate connected to node 40e.

A threshold voltage vtnb of transistor 40c is made slightly larger than the threshold voltage Vtna of transistor 36 included in reference potential generating stage 30. A threshold voltage Vtpb of transistor 40d is made slightly smaller than the threshold voltage Vtpa of transistor 37 included in reference potential generating stage 30.

The push-pull current-mirror amplifying stage further includes a p-channel MOS transistor 40g connected between power supply potential node 10 and a node 40h, and having its gate connected to node 40b; an n-channel MOS transistor 40i connected between node 40h and output node 50, and having its gate connected to node 40h; a p-channel MOS transistor 40j connected between output node 50 and a node 40p, and having its gate connected to node 40p; and an n-channel MOS transistor 40r connected between node 40p and ground potential node 20, and having its gate connected to node 40e.

β, which is a constant proportional to gate width/gate length, of transistor 40g is set to k times that of transistor 40a. Transistors 40a and 40g constitute a current-mirror circuit having the mirror ratio k.

β of transistor 40r is set to k times that of transistor 40f. Transistors 40f and 40r constitute a current-mirror circuit having the mirror ratio k.

The push-pull output stage includes an n-channel MOS transistor 40s connected between power supply potential node 10 and output node 50 and having its gate connected to node 40h, and a p-channel MOS transistor 40t connected between output node 50 and ground potential node 20 and having its gate connected to node 40p. β of transistor 40s is set to m times that transistor 40i. Transistors 40i and 40s constitute a current-mirror circuit having the mirror ratio m. β of transistor 40t is set to m times that of transistor 40j. Transistors 40j and 40t constitute a current-mirror circuit having the mirror ratio m. Description will now be made on the operation of the intermediate potential generator shown in FIG. 15.

In reference potential generating stage 30, resistance elements 31 and 33 have an identical resistance value, so that a potential N1 of node 32 is Vcc/2.

Each of resistance elements 34 and 39 has a high resistance value of approximately 1 MΩ. In the case of the power supply potential Vcc of 3V, a current flowing through transistors 36 and 37 is 3V/(1 MΩ+1 MΩ)=1.5 μA, approximately. Each of transistors 36 and 37 has its gate and drain connected to each other, and operates in a saturation region. A current Ids flowing through the MOS transistor in the saturation region, therefore, is described by:

$$Ids=\beta(Vgs-Vth)^2,$$

where Vgs is a gate to source voltage of MOS transistor and Vth is a threshold voltage. This current value is very small. Accordingly, the gate to source voltage, namely a voltage between nodes 32 and 35, of n-channel MOS transistor 36 approximates to the threshold voltage Vtna, so that a potential N2 of node 35 approximates to (½) Vcc+Vtna.

Similarly, in p-channel MOS transistor 37, a gate to source voltage thereof, namely a voltage between nodes 38 and 32 approximates to the threshold voltage Vtpa, so that a potential N3 of node 38 approximates to (½) Vcc–|Vtpa|, approximately.

In drive stage 40, a threshold voltage Vtnb of n-channel MOS transistor 40c is set slightly larger than the threshold voltage Vtna of n-channel MOS transistor 36. A threshold voltage Vtpb of p-channel MOS transistor 40d is set slightly smaller than the threshold voltage Vtpa of p-channel MOS transistor 37.

In the case of a potential of output node 50 being approximately the intermediate potential (½) Vcc, transistors 40c and 40d are both brought into the OFF state.

When the potential of output node 50 is not more than (½) Vcc–(Vtna–Vtnb), n-channel MOS transistor 40c is brought into the ON state, while p-channel MOS transistor 40t is held in the OFF state. Accordingly, a current I1 flows from power supply potential node 10 via p-channel MOS transistor 40a and n-channel MOS transistor 40c to output node 50.

Transistor 40g constitutes a current-mirror circuit having the mirror ratio k together with transistor 40a, so that a mirror current k·I1 flows from power supply potential node 10 via transistors 40g and 40i to output node 50. Also, transistor 40s constitutes a current-mirror circuit having the mirror ratio m together with transistor 40i, so that a mirror current k·m·I1 flows from power supply potential node 10 via transistor 40s to output node 50. The potential of output node 50 rises up to (½) Vcc+Vtna–Vtnb because of the current charge through these three paths, thereby rendering transistor 40c and thus all the transistors constituting the current-mirror circuit OFF, which prevents a charging current from power supply potential 10 to output node 50.

When the potential of output node 50 exceeds (½) Vcc+ |Vtpb|–|Vtpa|, p-channel MOS transistor 40d is brought into the ON state, while n-channel MOS transistor 40c is held in the OFF state. A current I2 flows from output node 50 via transistors 40d and 40f to ground potential node 20. Transistor 40r constitutes a current-mirror circuit having the mirror ratio k, together with transistor 40f, so that a mirror current k·I2 flows from output node 50 via transistors 40j and 40r to ground potential node 20.

P-channel MOS transistor 40t also constitutes a current-mirror circuit having the mirror ratio m, together with p-channel MOS transistor 40j, so that a mirror current k·m·I2 flows from output node 50 via transistor 40t to ground potential node 20. Consequently, output node 50 is discharged at high speed so that the potential thereof drops.

When the potential of output node 50 drops to (½) Vcc+|Vtpb|–|Vtpa|, p-channel MOS transistor 40t is brought into the OFF state, so that a current path between output node 50 and ground potential node 20 is cut off.

The potential VOUT of output node 50 is represented by:

$$(½) \text{Vcc}+\text{Vtna}-\text{Vtnb} < \text{VOUT} < (½) \text{Vcc}+|\text{Vtpb}|-|\text{Vtpa}| \quad (1)$$

The values |Vtna–Vtnb| and |Vtpb|–|Vtpa| are very small. Accordingly, the potential VOUT of output node 50 is approximately (½) Vcc.

In reference potential generating stage 30 of the intermediate potential generator structured as the above, however, a current normally flows from power supply potential node 10 into ground potential node 20 via resistance elements 31 and 33. Also, a current normally flows from power supply potential node 10 to ground potential node 20 via resistance element 34, n-channel MOS transistor 36, p-channel MOS transistor 37, and resistance element 39. In order to reduce the regular current flow, a resistance value of each of resistance elements 31, 33, 34 and 39 should be made large. In the case of these resistance elements being formed of polysilicon, since a polysilicon interconnection layer for resistance elements is formed in the identical process steps with an ordinary polysilicon interconnection layer for signal transmission, the sheet resistance values thereof are identical. The sheet resistance of the polysilicon interconnection layer cannot be made large for prevention of propagation delay of a signal. As a result, the length of the polysilicon interconnection layer must be made considerably large for forming a resistance element having a higher resistance value, which increases a layout area for resistance elements 31, 33, 34 and 39.

The use of a channel resistance of a MOS transistor can be considered as a solution for such increase of the layout area of the resistance element. In general, a resistance element having a small layout area and a high resistance value can be implemented by the use of a channel resistance of a MOS transistor.

FIG. 16 shows the structure of an intermediate potential generator with a channel resistance of a MOS transistor as a resistance element. Generally, a p-channel MOS transistor has its backgate connected to power supply potential Vcc, while an n-channel MOS transistor has its backgate connected to ground potential GND. Usually, in the structure of a resistance element, a p-channel MOS transistor is used for a MOS transistor connected to power supply node 10, and an n-channel MOS transistor is used for a resistance element connected to ground potential node 20.

In FIG. 16, a p-channel MOS transistor 31a is connected between power supply potential node 10 and a node 32, and an n-channel MOS transistor 33a is connected between node 32 and ground potential node 20. The gate of transistor 31a is connected to ground potential node 20. The gate of transistor 33a is connected to power supply potential node 10.

Similarly, a p-channel MOS transistor 34a is connected between power supply potential node 10 and a first internal output node 35. An n-channel MOS transistor 39a is connected between a second output node 38 and ground potential node 20. The gate of transistor 34a is connected to ground potential node 20, and the gate of transistor 39a is connected to power supply potential node 10.

In the reference potential generating stage shown in FIG. 16, the channel resistances of transistors 31a and 33a should be identical, as well as the channel resistances of transistors 34a and 39a should be identical.

However, a p-channel MOS transistor and an n-channel MOS transistor are different in the manufacturing process steps. It is, therefore, very difficult to make the channel resistances of the n-channel MOS transistor and the p-channel MOS transistor equal, due to variation in parameter, that is, variation in mask offset and impurity concentration, and the like. Therefore, first node 32 cannot be set accurately to the intermediate potential (½) vcc, so that the first and second reference potentials cannot be provided accurately.

When n-channel MOS transistors are employed in place of p-channel MOS transistors 31a and 34a, they should have their gates connected to power supply potential node 10, and have their backgates connected to ground potential node 20. In this case, the n-channel MOS transistor connected to the power supply potential node and that connected to ground potential node have different drain potentials and backgate to source voltages, so that they have different operating characteristics. Consequently, exactly equal channel resistances cannot be implemented.

Referring back to FIG. 15, when the potential VOUT of output node 50 satisfies the expression (1), n-channel MOS transistor 40c and p-channel MOS transistor 40d in drive stage 40 are in the OFF state. Still in this case, since transistors 40c and 40d are not in the complete OFF state, a sub-threshold current Is flows from power supply potential node 10 via p-channel MOS transistor 40a and n-channel MOS transistor 40c to output node 50. The sub-threshold current Is also flows from output node 50 via p-channel MOS transistor 40d and n-channel MOS transistor 40f to ground potential node 20.

Such a sub-threshold current Is is multiplied by the factor of k by p-channel MOS transistor 40g, so that a current having a magnitude of k·Is flows through n-channel MOS transistor 40i from power supply potential node 10 to output node 50. The mirror current k·Is of the sub-threshold current Is is further multiplied by the factor of m by transistor 40s, so that a current having a magnitude of k·m·Is from power supply potential node 10 to output node 50.

Also, transistors 40f and 40r constitute a current-mirror circuit, so that a sub-threshold current of k·Is flows from output node 50 via transistors 40j and 40r to ground potential node 20. This sub-threshold current further multiplied by the factor of m by transistor 40t, so that a current of k·m·Is flows from output node 50 to ground potential node 20.

Specifically, in drive stage 40, a current having a magnitude of (1+k+k·m) Is flows from power supply potential node 10 to ground potential node 20 at a steady state where the intermediate potential (½) Vcc is generated, causing increase of power consumption at the steady state.

In order to reduce power consumption at a steady state, the threshold voltage Vtnb of n-channel MOS transistor 40c and the absolute value |Vtpb| of the threshold voltage of p-channel MOS transistor 40d can be large so as to reduce a sub-threshold current flowing through transistors 40c and 40d. In such a case, however, |Vtna–Vtnb| and ||Vtpb|–|Vtpa|| become large in the expression (1), resulting in large deviation of the potential VOUT of output node 50 from the intermediate potential (½) Vcc.

SUMMARY OF THE INVENTION

One object of the present invention is to provide an intermediate potential generating circuit of small layout area and low power consumption.

Another object of the present invention is to provide an intermediate potential generator capable of generating an intermediate potential accurately.

Still another object of the present invention is to provide a semiconductor memory device including an intermediate potential generator generating an intermediate potential accurately and stably with low power consumption.

The intermediate potential generator in accordance with one aspect of the present invention includes a first reference potential generating block connected between a node receiving a first potential and a node receiving a second potential, and including, as load element, first and second insulated gate type field effect transistors of the same conductivity type connected in the same manner, for generating a first reference potential; a second reference potential generating block connected between the node receiving the first potential and the node receiving the second potential, and including, as load element, third and fourth insulated gate type field effect transistors of the same conductivity type connected in the same structure, for generating a second reference potential lower than the first potential; a driving first insulated gate type field effect transistor supplied with a current from a first potential supplying node to transmit the first reference potential to an output node in a source follower manner; and a driving second insulated gate type field effect transistor connected between the output node and a node receiving the second potential to transmit the second reference potential to the output node in the source follower manner.

In the blocks for generating the first and second reference potentials, the insulated gate type field effect transistors connected in the same manner are made use of as load element. Accordingly, the voltage-current characteristics of these load elements can be made identical, and desired first and second reference potentials can be generated with a small occupied area.

In addition, since the insulated gate type field effect transistor is used as load element, a current flow from the node receiving the first potential to the node receiving the second potential can be made very small by increasing β or a channel resistance thereof, whereby power consumption can be reduced largely.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
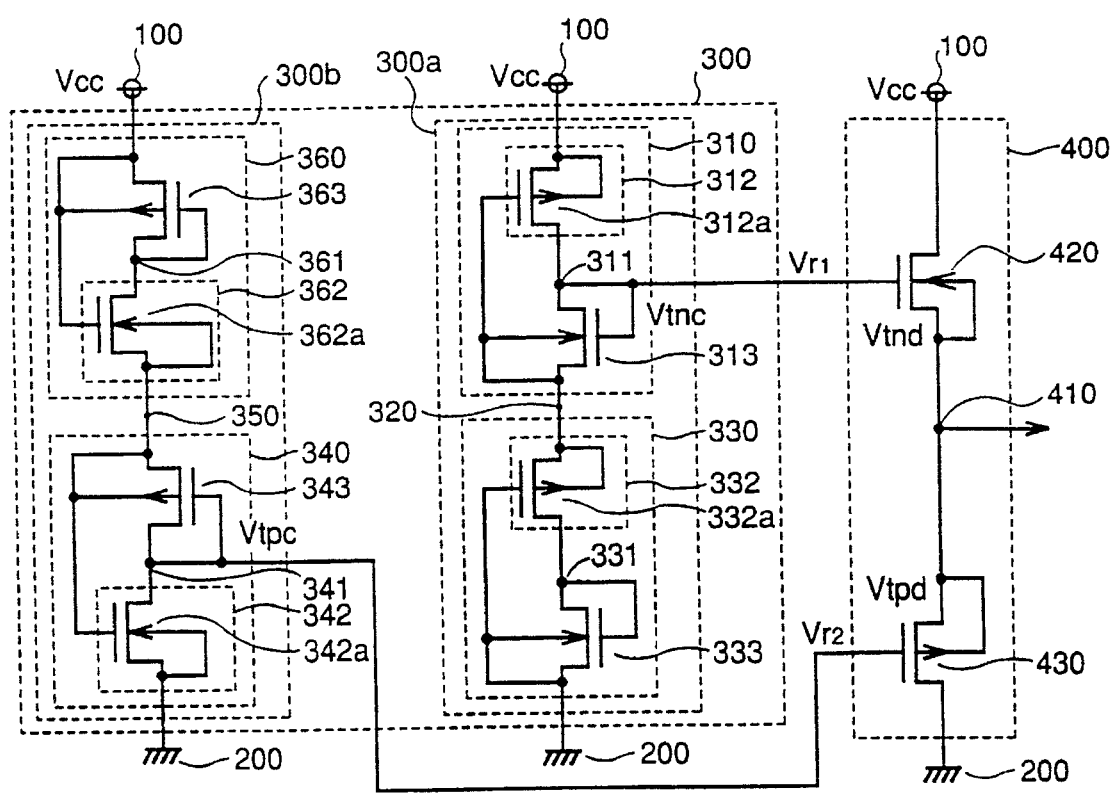
FIG. 1 is a schematic diagram showing the structure of an intermediate potential generating circuit in accordance with a first embodiment of the present invention.

FIG. 1 is a schematic diagram showing the structure of an intermediate potential generator in accordance with a first embodiment of the present invention. In FIG. 1, the intermediate potential generator includes a reference potential generating stage 300 providing a first reference potential Vr1 and a second reference potential Vr2, and a drive stage 400 receiving the first and second reference potentials Vr1 and Vr2 to provide an intermediate potential (½) Vcc to an output node 410.

Reference potential generating stage 300 includes a first reference potential generating block 300a generating the first reference potential Vr1, and a second reference potential generating block 300b generating the second reference potential Vr2. First reference potential generating block 300a includes first and second circuits 310 and 330 having identical electrical-characteristics. First circuit 310 is connected between a power supply potential node 100 and a node 320, and second circuit 330 is connected between node 320 and a ground potential node 200.

First circuit 310 includes a load circuit 312 of high resistance connected between power supply potential node 100 and a node 311, and an n-channel MOS transistor 313 connected between node 311 and node 320, and having its gate connected to node 311. Load circuit 312 includes a p-channel MOS transistor 312a of high resistance having its gate connected to node 320, its source and backgate connected to power supply potential node 100, and its drain connected to node 311. N-channel MOS transistor 313 receives a potential of node 320 at its backgate, and has a threshold voltage Vtnc. N-channel MOS transistor 313 has the ratio W/L of a channel width W and a channel length L set so large that the gate to source voltage thereof is the threshold voltage Vtnc when a current flows therethrough.

Second circuit 330 includes a load circuit 332 of a high resistance connected between nodes 320 and 331, and an n-channel MOS transistor 333 connected between node 331 and ground potential node 200, and having its gate connected to node 331. Load circuit 332 includes a p-channel MOS transistor 332a having its backgate connected to node 320, its source connected to node 320, its drain connected to node 331, and its gate connected to ground potential node 220. The backgate of transistor 333 is connected to ground potential node 220. Transistor 312a included in first load circuit 312 has the same backgate to source voltage as that of transistor 332a of second load circuit 332. Accordingly, the backgate bias effect of transistors 312a and 332a can be made identical, so that transistors 312a and 332a have identical operating characteristics.

Similarly, transistor 313 has the backgate to source voltage as that of transistor 333, so that the backgate bias effect of transistors 313 and 333 can be made identical, whereby transistors 313 and 333 have identical operating characteristics. As a result, the voltage-current characteristics of first and second circuits 310 and 330 can be made identical, whereby the intermediate potential (½) Vcc can be generated at node 320.

Second reference potential generating block 300b includes a third circuit 360 connected between power supply potential node 100 and a node 350, and a fourth circuit 340 connected between node 350 and ground potential node 200. Third circuit 360 includes a p-channel MOS transistor 363 connected between power supply potential node 100 and a node 361, and a third load circuit 362 connected between node 361 and intermediate potential node 350. Transistor 363 has its gate connected to node 361, and its backgate connected to power supply potential node 100. Third load circuit 362 includes an n-channel MOS transistor 362a. N-channel MOS transistor 362a has its drain connected to node 361, its backgate connected to node 350, and its gate connected to power supply potential node 100.

Fourth circuit 340 includes a p-channel MOS transistor 343 connected between nodes 350 and 341, and having its gate connected to node 341, and a load circuit 342 of high resistance connected between node 341 and ground potential node 200. Transistor 343 has its backgate connected to node 350. Load circuit 342 includes an n-channel MOS transistor 342a. Transistor 342a has its gate connected to node 350, and its backgate connected to ground potential 200. Transistor 343 has a threshold voltage Vtpc, and has the ratio W/L of a channel width W and a channel length L set so large that the gate to source voltage thereof is the threshold voltage Vtpc when a current flows therethrough.

Third circuit 360 and fourth circuit 340 have the identical connection manner in which components are interconnected. Third and fourth circuits 360 and 340 thus have identical voltage-current characteristics and generate an intermediate potential (½) Vcc to node 350. Drive stage 400 includes an n-channel MOS transistor 420 connected between power supply potential node 100 and output node 410, and a p-channel MOS transistor 430 connected between output node 410 and ground potential node 200. N-channel MOS transistor 420 receives the first reference potential Vr1 at its gate, and has its backgate connected to output node 410. Transistor 420 has a threshold voltage Vtnd. The threshold voltage Vtnd is set to a value higher than the threshold voltage Vtnc of transistor 313 by 1% of the intermediate potential (½) Vcc. In the case of the power supply potential Vcc of 3V, for example, the threshold voltage Vtnd of transistor 420 is set higher than the threshold voltage Vtnc of transistor 313 by 10 mv to 20 mv, approximately.

P-channel MOS transistor 430 has its backgate connected to output node 410, and has a threshold voltage Vtpd. The threshold voltage Vtpd of transistor 430 is set to a value lower than the threshold voltage Vtpc of transistor 343 by approximately 1% of the intermediate potential (½) Vcc. In the case of the power supply potential Vcc of 3 V, for example, the threshold voltage Vtpd is set lower than the threshold voltage Vtpc of transistor 343 by 10 to 20 mv, approximately. Description will now be given on the operation.

In reference potential generating stage 300, a current flows from power supply potential node 100 supplied with the power supply potential Vcc via first and second circuits 310 and 330 to ground potential node 200. First and second circuits 310 and 330 have the same voltage-current characteristics. The potential of node 320 becomes the intermediate potential (½) Vcc between the power supply potential Vcc and the ground potential GND. The channel resistances of p-channel MOS transistors 312a and 332a are set sufficiently large. Accordingly, in first reference potential generating block 300a, a very small current flows from power supply potential node 100 to ground potential node 200. Transistor 313 has the current, causing a voltage drop of the threshold voltage thereof. The potential of node 331 becomes Vtnc'. The threshold voltages Vtnc and Vtnc' are equal to each other so long as transistors 313 and 333 are formed to have the same size and the same characteristics with each other. As a result, drain currents Ids flowing through transistors 312a and 332a become equal to each other, so that the intermediate potential at node 320 is maintained. When the potential of node 320 rises over the intermediate potential (½) Vcc, the resistance value of transistor 332a becomes slightly smaller than that of transistor 312a, so that larger current flows through transistor 333 than through transistor 313, resulting in decrease in the potential of node 320. To the contrary, when the potential of node 320 is lower than the intermediate potential (½) Vcc, the resistance of transistor 312a is smaller than that of transistor 332a, so that a larger current flows from power supply potential node 100 to node 320, whereby the potential of node 302 rises. Therefore, the potential of node 320 should be set accurately to the intermediate potential (½) Vcc.

Third and fourth circuits 360 and 330 also have the identical voltage-current characteristics. The potential of node 350 is thus the intermediate potential (½) Vcc. The ratio W/L of the gate width W and the gate length L of ratio of the channel width W and the channel length L set sufficiently large. The gate to source voltage of transistor 313, therefore, becomes the threshold voltage Vtnc, approximately, so that the first reference potential Vr1 provided to node 311 is (½) Vcc+Vtnc.

Brief description will now be made on why first and second circuits 310 and 330 have the identical voltage-current characteristics. Transistor 312a included in load circuit 312 has its backgate and source connected to power supply potential node 100, and its gate connected to node 320. The gate to source voltage thereof, therefore, is a potential between the power supply potential Vcc applied from power supply potential 100 and the potential of node 320. Each of transistors 312a, 313, 332a and 333 has its backgate and source connected to each other, the threshold voltage of which is constant. When the intermediate potential (½) Vcc appears at node 320, the potential difference between the gate and source of transistor 312a, as well as transistor 332a, is (½) Vcc. In this case, therefore, transistors 312a and 332a have the identical voltage-current characteristics so long as they are formed to have the same size and the same channel resistance with each other.

Similarly, each of transistors 313 and 333 operates in the saturation region upon application of a small transistor 343 is defined sufficiently large, so that transistor 343 has the gate to source voltage equal to the threshold voltage Vtpc thereof. Accordingly, the potential Vr2 of node 341 is (½) Vcc−|Vtpc|.

In drive stage 400, the threshold voltage Vtnd of transistor 420 is set larger by 1% approximately than the threshold voltage Vtnc of transistor 313. The absolute value |Vtpd| of the threshold voltage of transistor 430 is set larger than the absolute value |Vtpc| of the threshold voltage of transistor 343 by 1% approximately. Transistor 420 receives the first reference potential Vr1 (=(½) Vcc+Vtnc) at its gate. Transistor 430 receives the second reference potential Vr2 (=(½) Vcc−|Vtpc|) at its gate.

When the potential of output node 410 becomes lower than the intermediate potential (½) Vcc by not less than |Vtnd−Vtnc|, in other words, when the potential of output node 410 drops to not more than (½) Vcc+Vtnc−Vtnd, transistor 420 is brought into the ON state, while transistor 430 is held in the OFF state. Therefore, output node 410 is charged from power supply potential node 100 through transistor 420, thereby increasing the potential thereof.

When the potential of output node 410 is higher than the intermediate potential ½ Vcc by not less than |Vtpd|−|Vtpc|, in other words, the potential of output node 410 is not less than (½) Vcc−|Vtpc|+|Vtpd|, p-channel MOS transistor 430 is brought into the ON state, while transistor 420 is held in the OFF state. Therefore, output node 410 is discharged to ground potential node 200 through transistor 430, thereby reducing the potential thereof.

|Vtnd−Vtnc| is approximately 10–20 mV for Vcc=3 V, and |Vtpd−Vtpc| is also approximately 10–20 mV for Vcc=3 V.

When the potential V of output node 410 at node 410 for supplying the intermediate potential the intermediate potential is:

(½) Vcc−|Vtnd−Vtnc|<V<(½) Vcc+|Vtpd−Vtpc|, transistors 420 and 430 are both in the OFF state.

In drive stage 400, the potential of output node 410 can be set approximately to the intermediate potential (½) Vcc, by setting the threshold voltage Vtnd of n-channel MOS transistor 420 slightly higher than the threshold voltage Vtnc of n-channel MOS transistor 313, and the threshold voltage Vtpd of p-channel MOS transistor 430 slightly lower than the threshold voltage Vtpc of p-channel MOS transistor 343. At this time, both transistors 420 and 430 can be brought into the non-conductive state, so that a current flow from power supply potential node 100 to ground potential node 200 can be made smaller in drive stage 400, whereby power consumption can be decreased.

For example, the case is considered where the resistance value of the channel resistance at each of transistors 312a, 332a, 342a and 362a is increased from 1 MΩ to 2 MΩ, with the power supply potential Vcc=3 V and the threshold voltage Vtnc=|Vtpc|=0.5 V. Currents consumed in reference potential generating stage 300 are represented for respective resistance values by:

2·(Vcc−((½) Vcc+Vtnc))/1 MΩ=2 μA; for the resistance value of 1 MΩ, and

2·(Vcc−((½) Vcc+Vtnc))/2 MΩ=1 μA; for the resistance value 2 μΩ, whereby current consumption can be reduced by 1 μA.

In addition, since no current-mirror circuit is used, even if a sub-threshold current Is flows through transistors 420 and 430, such a current flows only from power supply potential node 100 to ground potential node 200 via transistors 420 and 430, causing no mirror current, whereby current consumption can be largely reduced at a steady state.

Figure 2:
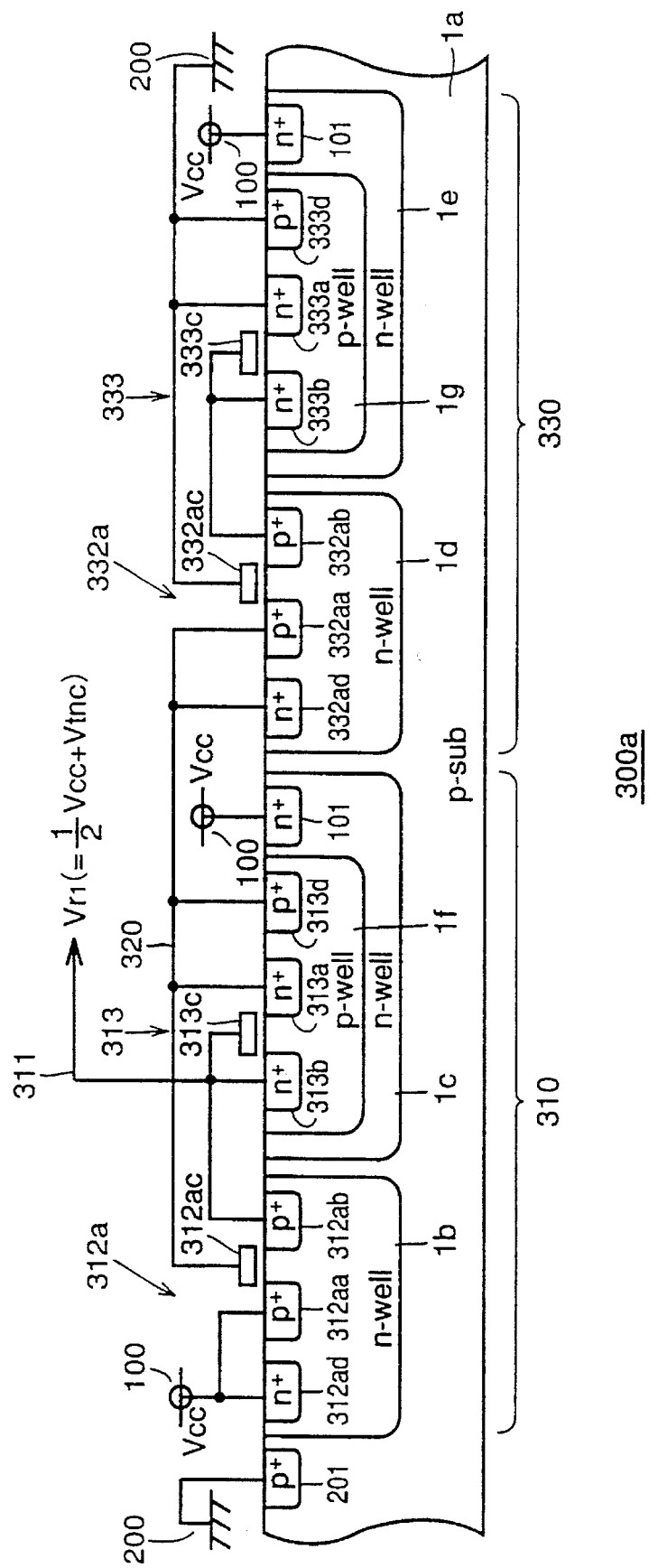
FIG. 2 is a schematic cross sectional view showing the structure of the first reference potential generating block shown in FIG. 1.

FIG. 2 is a schematic cross sectional view showing the structure of first and second circuits 310 and 330 shown in FIG. 1. In FIG. 2, first and second circuits 310 and 330 included in first reference potential generating block 300a are formed on the surface of a p-type semiconductor substrate 1a having p-type ions doped at low concentration.

First circuit 310 is formed in n-type wells 1b and 1c formed on the surface of p-type semiconductor substrate 1a, and second circuit 330 is formed in n-type wells 1d and 1e formed on the surface of p-type semiconductor substrate 1a. N-type wells 1b to 1e are formed by implanting n-type ions, such as phosphorus. N-type wells 1b to 1e are electrically isolated from p-type semiconductor substrate 1a by pn junction therebetween.

On the surface of n-type well 1c formed is a p-type well 1f, and on a surface of n-type well 1e formed is a p-type well 1g. P-type wells 1f and 1g are formed by implanting p-type ions, such as boron, at higher concentration than that of semiconductor substrate 1a. The substrate structure including three wells, namely, n-type well 1b, p-type well 1f, and n-type well 1c in which p-type well 1f is formed, is referred to as a triple-well structure.

On the surface of n-type well 1b, impurity regions 312aa and 312ab are formed by implanting p-type ions at high concentration, and an n-type impurity region 312ad is formed by implanting n-type impurities at a high concentration. Impurity region 312aa forms the source of transistor 312a shown in FIG. 1, connected to power supply potential node 100. N-type impurity region 312ad is connected to power supply potential node 100 to supply n-type well 1b, namely the backgate of transistor 312a, with the power supply potential Vcc. P-type impurity regions 312aa and 312ab are formed spaced apart from each other. On the channel region between impurity regions 312aa and 312ab formed is a gate electrode layer 312ac with a gate insulating film, not shown, interposed thereunder. P-type impurity region 312ab forms the drain of transistor 312a.

On the surface of n-type well 1c, an n-type impurity layer 101 is formed spaced apart from p-type well 1f by implanting n-type ions at high concentration. Impurity region 101 is connected to power supply potential node 100 to supply n-type well 1c with the power supply potential Vcc.

On the surface of p-type well 1f, n-type impurity regions 313a and 313b are formed spaced apart from each other by implanting n-type ions at high concentration, and a p-type impurity region 313d is formed spaced apart from n-type impurity region 313a by implanting p-type impurity ions at high concentration. On the channel region between n-type impurity regions 313a and 313b formed is a gate electrode layer 313c with a gate insulating film, not shown, interposed thereunder. N-type impurity region 313a forms the source region of transistor 313 shown in FIG. 1, while n-type impurity region 313b forms the drain region of transistor 313. Impurity region 313a is connected to node 320. Gate electrode layer 313c and n-type impurity region 313b are connected to node 311. P-type well 1f and n-type well 1c can be reversely biased by biassing n-type well 1c to the power supply potential Vcc through n-type impurity region 101, so that p-type well 1f and n-type well 1c can be electrically isolated from each other.

On the surface of n-type well 1d, high concentration p-type impurity regions 332aa and 332ab are formed spaced apart from each other, and a high concentration n-type impurity region 332ad is formed. On the channel region between p-type impurity regions 332aa and 332ab is formed a gate electrode layer 332ac with a gate insulating film, not shown, interposed thereunder. P-type impurity region 332aa forms the source region of transistor 332a shown in FIG. 1, while p-type impurity region 332ab forms the drain region of transistor 332a. N-type impurity region 332ad, together with p-type impurity region 332aa, is connected to node 320, thereby biassing n-type well 1d to the same potential as that of the source region.

On the surface of p-type well 1g, high concentration n-type impurity region 333a and 333b and a high concentration p-type impurity 333d are formed spaced apart from each other. In p-type well 1g is formed transistor 333 shown in FIG. 1. On the channel region between n-type impurity region 333a and 333b is formed a gate electrode layer 333c with a gate insulating film, not shown, interposed thereunder. N-type impurity region 333b is electrically connected to p-type impurity region 332ab. N-type impurity region 333a, together with p-type impurity region 333d, is connected to ground potential node 200. On n-type well 1e, a high concentration n-type impurity region 101 is formed spaced apart from p-type well 1g. N-type impurity region 101 is connected to power supply potential node 100 to supply n-type well 1e with the power supply potential Vcc. P-type well 1g and n-type well 1e are reversely biased by biassing n-type well 1e to the power supply potential Vcc, whereby p-type well 1g and n-type well 1e are electrically isolated from each other.

On the surface of semiconductor substrate 1a is formed a high concentration P-type impurity region 201. N-type impurity region 201 is connected to ground potential node 200 to bias semiconductor substrate 1a to a ground potential level. N-type wells 1b to 1e are formed spaced apart from each other on the surface of semiconductor substrate 1a, and electrically isolated with each other and has no interaction with semiconductor substrate 1a. Therefore, transistors 312a, 313, 332a and 333 operate only according to a signal applied through signal interconnection.

The bias potential of p-type well 1g in which n-channel MOS transistor 333 is formed is a ground potential, equal to the bias potential of semiconductor substrate 1a. P-type well 1g need not be formed in n-type well 1e, that is, transistor 333 may be formed on the surface of semiconductor substrate 1a.

Each of transistors 312a and 332a serving as load resistance is formed of a p-channel MOS transistor, whose resistance value is determined by a channel resistance. Transistors 312a and 332a, therefore, are formed within n-type wells 1b and 1d in the same process, so as to have identical electrical characteristics. In addition, since each of transistors 312a and 332a has its source and backgate interconnected to each other, backgate bias effect can be prevented. Since the threshold voltage thereof can be determined by the concentration of impurities implanted in the surface of the channel region, it can be held constant in operation. The same effects can be obtained in transistors 313 and 333.

The layout area of load transistors 312a and 332a is largely reduced compared to a layout area required for interconnection resistance of a polysilicon layer and the like. For example, comparison will be made between a resistance element formed of a polysilicon layer, doped with phosphorus having the concentration of approximately $10^{20} \text{cm}^{-3}$ and having the sheet resistance of approximately 100Ω/□ and a resistance element formed of a channel resistance of a transistor and having the sheet resistance of approximately 10 KΩ/□. The line width of the polysilicon layer is made equal to the channel width of the transistor. If a MOS transistor is used, the same resistance value can be implemented with approximately 1/100 of the area of the polysilicon layer.

Additionally, the use of the triple-well structure enables n-channel transistor 313 in first circuit 310 and n-channel transistor 333 in second circuit 330 to have the same backgate to source voltage, as well as enabling p-channel MOS transistor 312a in first circuit 310 and p-channel MOS transistor 332a in second circuit 330 to have the same backgate to source voltage. Consequently, first circuit 310 and second circuit 330 can have the same voltage-current characteristics, so that the potential of intermediate node 320 can be accurately set to the intermediate potential (½) Vcc, whereby the first reference potential Vr1 of a desired value can be provided accurately.

Figure 3:
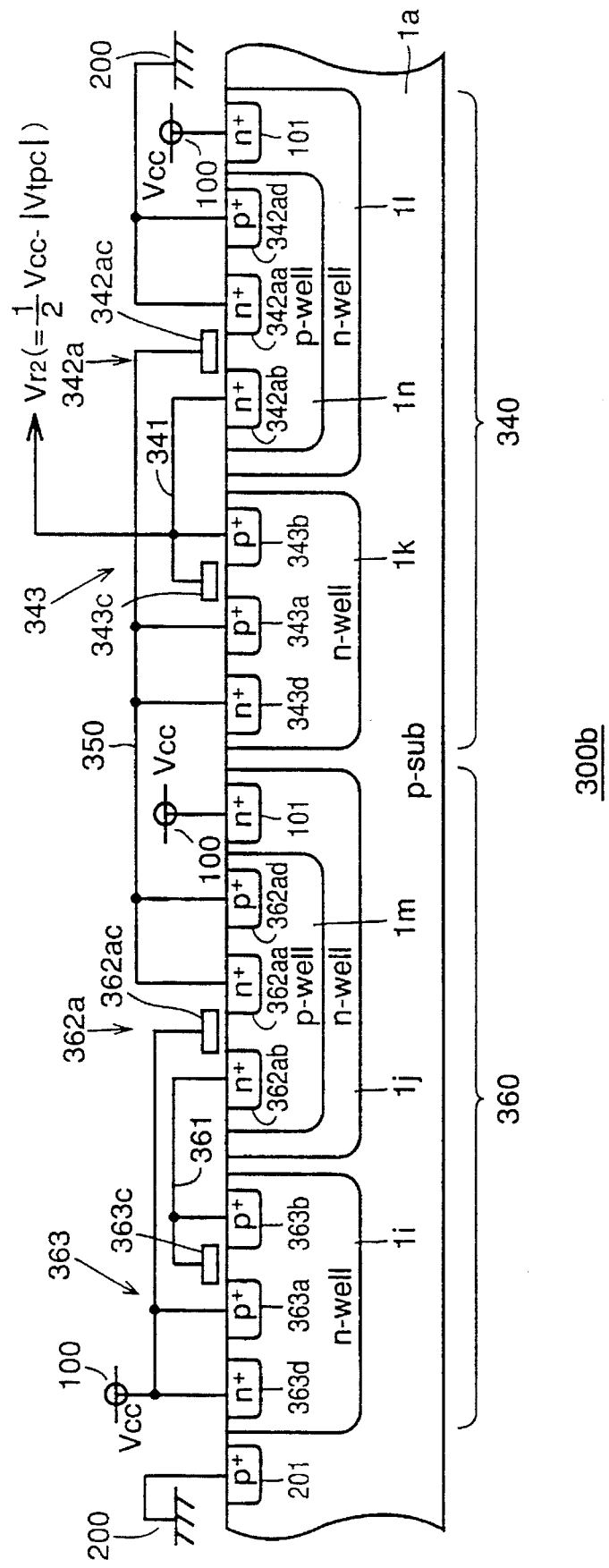
FIG. 3 is a schematic cross sectional view showing the structure of the second reference potential generating block shown in FIG. 1.

FIG. 3 is a schematic cross sectional view showing the structure of second reference potential generating block 300*b* shown in FIG. 1. In FIG. 3, second reference potential generating block 300*b* is formed on the surface of p-type semiconductor substrate 1*a*.

On the surface of p-type semiconductor substrate 1*a* formed are n-type wells 1*i*, 1*j*, 1*k*, and 1*l* spaced apart from each other. N-type wells 1*i* to 1*l* are formed by implanting n-type impurity ions, so as to be electrically isolated from semiconductor substrate 1*a* by pn junction therebetween. On these surface of n-type well 1*j*, a p-type well 1*m* having p-type impurity ions implanted at higher concentration than in semiconductor substrate 1*a*, and high concentration n-type impurity region 101 are formed spaced apart from each other. Similarly, a p-type well 1*n* and a n-type impurity region 101 are formed on the surface of n-type well 1*l*. N-type impurity region 101 is connected to power supply potential node 100 to supply the power supply potential Vcc to n-type wells 1*j* and 1*l* respectively.

High concentration p-type impurity regions 363*a* and 363*b*, and high concentration n-type impurity region 363*d* are formed spaced apart from each other on the surface of n-type well 1*i*. A gate electrode layer 363*c* is formed on the surface of the channel region between p-type impurity regions 363*a* and 363*b* with a gate insulating film, not shown, interposed thereunder. Gate electrode layer 363*c* and p-type impurity region 363*b* are connected to a node 361. Impurity region 363*b* forms the source/drain of transistor 363 shown in FIG. 1. P-type impurity region 363*a* and n-type impurity region 363*d* are both connected to power supply potential node 100. P-type impurity region 363*a* forms the source region of transistor 363.

High concentration n-type impurity regions 362*aa* and 362*ab*, and a high concentration p-type impurity region 362*ab* are formed spaced apart from each other on the surface of p-type well 1*m*. A gate electrode layer 362*ac* is formed on the channel region between n-type impurity regions 362*aa* and 362*ab* with a gate insulating film, not shown, interposed thereunder. N-type. impurity region 362*aa* and p-type impurity region 362*ab* are connected to a node 350. N-type impurity region 362*ab* is connected to node 361, and gate electrode layer 362*ac* is connected to power supply potential node 100. N-type impurity region 362*aa* forms the source region of transistor 362*a*, and n-type impurity region 362*ab* forms the drain region of transistor 362*a*.

N-type impurity region 363*d* and p-type impurity region 360*d* have a function of providing backgate voltages of transistors 363 and 362*a*, respectively.

High concentration p-type impurity regions 343*a* and 343*b*, and a high concentration n-type impurity region 343*d* are formed spaced apart from each other on the surface of n-type well 1*k*. A gate electrode layer 343*c* is formed on the channel region between p-type impurity regions 343*a* and 343*b* with a gate insulating film, not shown, interposed thereunder. N-type impurity region 343*d* and p-type impurity region 343*a* are both connected to node 350. Gate electrode layer 343*c* and p-type impurity region 343*b* are connected to a node 341. P-type impurity region 343*a* serves as the source region of transistor 343, and p-type impurity region 343*b* serves as the drain region of transistor 343.

High concentration n-type impurity regions 342*aa* and 342*ab*, and a high concentration p-type impurity region 342*ad* are formed spaced apart from each other on the surface of p-type 1*n*. A gate electrode layer 342*ac* is formed on the channel region between n-type impurity regions 342*aa* and 342*ab* with a gate insulating film, not shown, interposed thereunder. N-type impurity region 342*aa*, together with p-type impurity region 342*ad*, is connected to ground potential node 200. Gate electrode layer 342*ac* is connected to node 350. N-type impurity region 342*ab* is connected to node 341. N-type impurity region 342*aa* serves as the source region of transistor 342*a*, and n-type impurity region 342*ab* serves as the drain region of transistor 342*a*. P-type impurity region 342*ad* provides the backgate potential to transistor 342*a*.

Also in the structure shown in FIG. 3, the triple-well structure is employed, where third and fourth circuits 360 and 340 can have the same voltage-current characteristics, whereby the intermediate potential (½) Vcc can be accurately generated at node 350, as in the structure shown in FIG. 2.

In addition, load transistors 362*a* and 342*a* included in load circuits 362 and 342 can implement a high resistance element whose layout area and thus occupied area are small.

Figure 4:
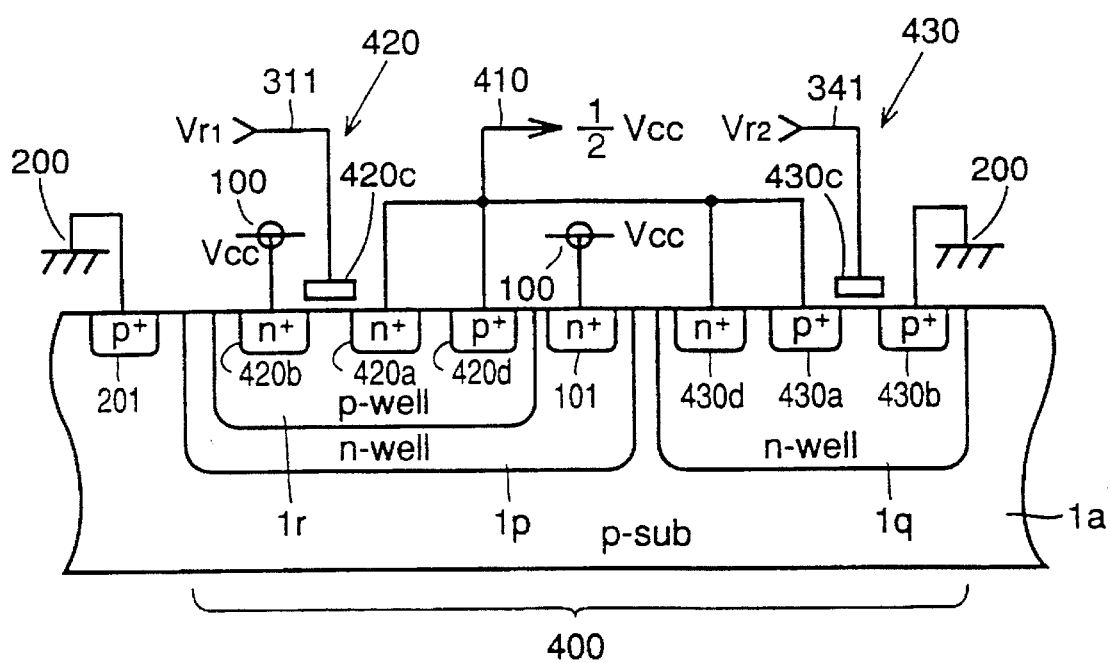
FIG. 4 is a schematic cross sectional view showing the structure of the drive stage shown in FIG. 1.

FIG. 4 is a schematic cross sectional view showing the structure of the drive stage shown in FIG. 1. In FIG. 4, drive stage 400 is formed in n-type wells 1*p* and 1*q* formed on the surface of p-type semiconductor substrate 1*a*. A p-type well 1*r* having p-type ions implanted at higher concentration than in substrate 1*a*, and n-type impurity region 101 are formed on the surface of n-type well 1*p*. N-type impurity region 101 is connected to power supply potential node 100 to supply the power supply potential Vcc to n-type well 1*p*.

High concentration n-type impurity regions 420*a* and 420*b*, and a high concentration p-type impurity region 420*d* are formed spaced apart from each other on the surface of p-type well 1*r*. A gate electrode layer 420*c* is formed on the channel region between n-type impurity regions 420*a* and 420*b* with a gate insulating film, not shown, interposed thereunder. N-type impurity region 420*a*, together with p-type impurity region 420*d*, is connected to an output node 410. N-type impurity region 420*b* is connected to power supply potential node 100. Gate electrode layer 420*c* is connected to node 311 to receive the first reference potential Vr1. N-type impurity region 420*a* forms the source region of transistor 420, and n-type impurity region 420*b* forms the drain region of transistor 420. P-type impurity region 420*d* biases p-type well 1*r* to the potential of node 410.

High concentration p-type impurity regions 430*a* and 430*b*, and a high concentration n-type impurity region 430*d* are formed spaced apart from each other on the surface of n-type well 1*q*. P-type impurity region 430*a*, together with n-type impurity region 430*a*, is connected to output node 410. P-type impurity region 430*b* is connected to ground potential node 200. A gate electrode layer 430*c* is formed on the channel region between p-type impurity regions 430*a* and 430*b* with a gate insulating film, not shown, interposed thereunder. Gate electrode layer 430*c* is supplied with the second reference potential Vr2 through node 341. P-type impurity region 430*b* forms the drain of transistor 430, and p-type impurity region 430*a* forms the source region of transistor 430. N-type impurity region 430*d* serves as the backgate potential applying electrode of transistor 430.

Also in the structure shown in FIG. 4, transistors have the same backgate to source voltage due to the triple-well structure, whereby respective threshold voltages of transistors are held constant. Consequently, the desired intermediate potential (½) Vcc can be accurately generated from output node 410.

Figure 5:
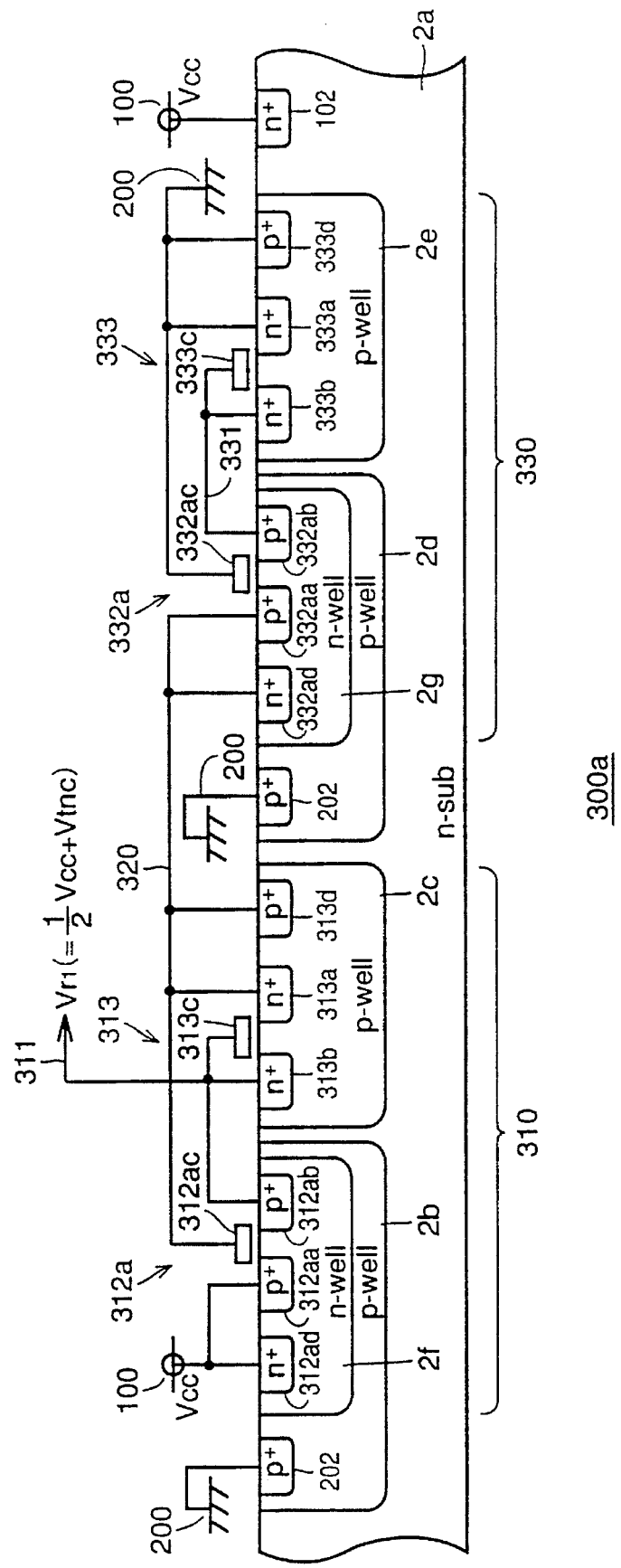
FIG. 5 is a cross sectional view showing another example of the first reference potential generating block shown in FIG. 1.

FIG. 5 is a schematic cross sectional view showing another example of the structure of first reference potential generating block 300*a* shown in FIG. 1. In the structure shown in FIG. 5, first reference potential generating block 300*a* is formed on an n-type semiconductor substrate 2*a*. P-type wells 2*b*, 2*c*, 2*d* and 2*e* are formed spaced apart from each other on the surface of p-type semiconductor substrate 2a. Apart from these p-type wells, a high concentration n-type impurity region 102 is formed on the surface of semiconductor substrate 2a. N-type impurity region 102 is connected to power supply potential node 100 to supply the power supply potential Vcc to semiconductor substrate 2a.

A transistor 312a is formed in p-type well 2b, a transistor 313 is formed in p-type well 2c, a transistor 332a is formed in p-type well 2d, and a transistor 333 is formed in p-type well 2b.

An n-type well 2f of higher concentration than in semiconductor substrate 2a, and a high concentration p-type impurity region 202 are formed spaced apart from each other on the surface of p-type well 2b. P-type impurity region 202 is connected to ground potential node 200 to supply the ground potential to p-type well 2b. High concentration p-type impurity regions 312aa and 312ab, and a high concentration n-type impurity region 312ad are formed spaced apart from each other on the surface of n-type well 2f. P-type impurity region 312aa and n-type impurity region 312ad are both connected to a node 100. P-type impurity region 312ab is connected to node 311. A gate electrode layer 312ac is formed on the channel region between p-type impurity regions 312ab and 312aa with a gate insulating film, not shown, interposed thereunder. N-type impurity region 312ad serves as the backgate potential applying electrode of transistor 312a, p-type impurity region 312aa serves as the source of transistor 12a, and p-type impurity region 312ab serves as the drain of transistor 312a.

High concentration n-type impurity regions 313a and 13b, and a high concentration p-type impurity region 313d are formed spaced apart from each other on the surface of p-type well 2c. N-type impurity region 313a and p-type impurity region 313d are both connected to a node 320. N-type impurity region 313b is connected to node 311. A gate electrode layer 313c is formed on the channel region between n-type impurity regions 313a and 313b with a gate insulating film, not shown, interposed thereunder. Gate electrode layer 313c is connected to node 311. P-type impurity region 313d serves as the backgate potential applying electrode of transistor 313, n-type impurity region 313a serves as the source of transistor 313, and N-type impurity region 313b serves as the drain of transistor 313.

High concentration p-type impurity region 202 and an n-type well 2g of higher concentration than in semiconductor substrate 2a are formed spaced apart from each other on the surface of p-type well 2d. P-type impurity region 202 is connected to ground potential node 200 to supply the ground potential to p-type well 2d.

High concentration p-type impurity regions 332aa and 332ab, and a high concentration n-type impurity region 332ad are formed spaced apart from each other on the surface of n-type well 2g. P-type impurity region 332aa and n-type impurity region 332ad are both connected to node 320, and p-type impurity region 332ab is connected to a node 331. A gate electrode layer 332ac is formed on the channel region between p-type impurity regions 332aa and 332ab with a gate insulating film, not shown, interposed thereunder. Gate electrode layer 332ac is connected to ground potential node 200. N-type impurity region 332ad serves as the backgate potential applying electrode of transistor 332a, p-type impurity region 332aa serves as the source of transistor 332a, and p-type impurity region 332ab serves as the drain of transistor 332a.

High concentration n-type impurity regions 333a and 333b, and a high concentration p-type impurity region 333d are formed spaced apart from each other on the surface of p-type well 2e. A gate electrode layer 333c is formed on the channel region between n-type impurity regions 333a and 333b with a gate insulating film, not shown, interposed thereunder. N-type impurity region 333b and gate electrode layer 333c are both connected to node 331. N-type impurity region 333a and p-type impurity region 333d are connected to ground potential node 200. P-type impurity region 333d serves as the backgate potential applying electrode of transistor 333, n-type impurity region 333a serves as the source of transistor 333, and n-type impurity region 333b serves as the drain of transistor 333.

Also in the structure shown in FIG. 5, a triple-well structure is employed, where respective transistors can have the same backgate to source voltage, whereby first and second circuits 310 and 330 can have the same voltage-current characteristics, as in the structure shown in FIG. 2.

In the structure shown in FIG. 5, since the potential of n-type well 2f forming transistor 312a is the power supply potential Vcc, which is equal to that of semiconductor substrate 2a, transistor 312a may be formed on the surface of n-type semiconductor substrate 2a.

Figure 6:
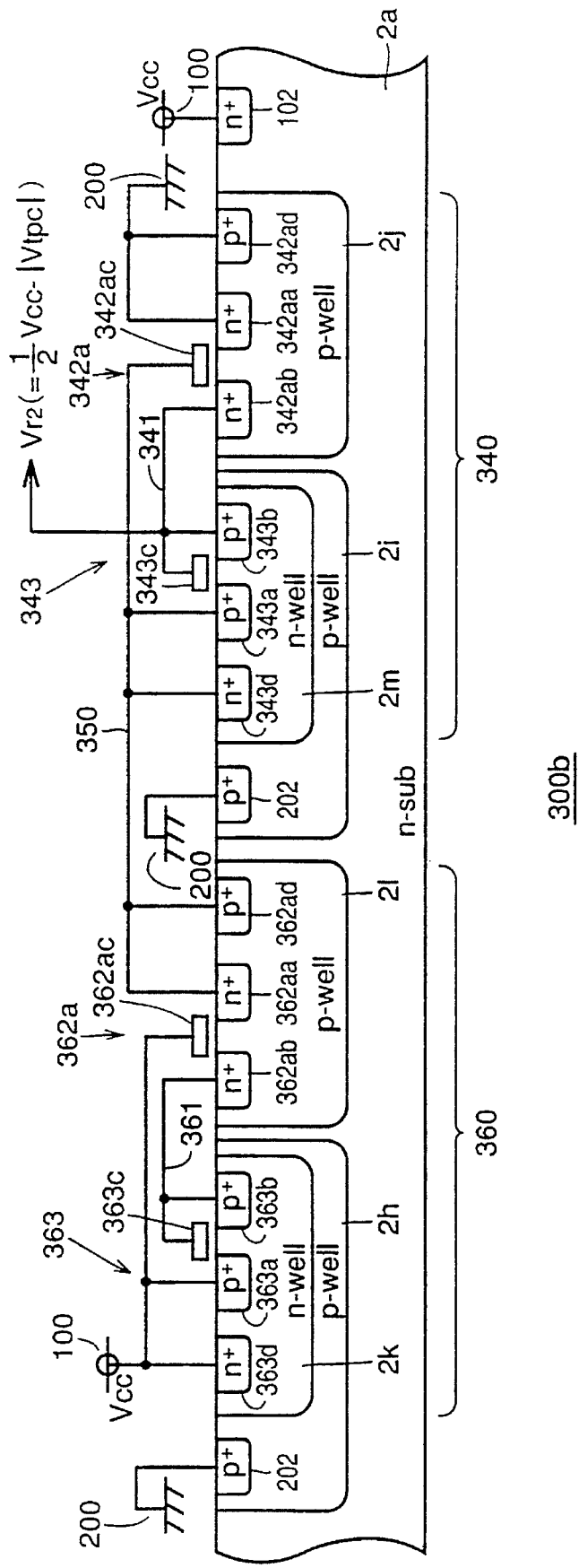
FIG. 6 is a cross sectional view showing another structure of the second reference potential generating block shown in FIG. 1.

FIG. 6 is a cross sectional view showing another structure of the third and fourth circuits shown in FIG. 1. In the structure shown in FIG. 6, third and fourth circuits 360 and 340 are formed on an n-type semiconductor substrate 2a of low impurity concentration. P-type wells 2h, 2i, 2j, and 2l, and a high concentration n-type impurity region 102 having n-type ions implanted at high concentration are formed spaced apart from each other on the surface of n-type semiconductor substrate 2a. N-type impurity region 102 is connected to power supply potential node 100. A transistor 63 is formed on p-type well 2h, a load transistor 362a is formed on p-type well 21, a transistor 343 is formed on p-type well 2i, and a load transistor 342a is formed on p-type well 2j.

A high concentration p-type impurity region 202 and an n-type well 2k of higher concentration than in substrate 2a are formed spaced apart from each other on the surface of p-type well 2h. P-type impurity region 202 is connected to ground potential node 200 to supply the ground potential to p-type well 2h. High concentration p-type impurity regions 363a and 363b, and a high concentration n-type impurity region 363d are formed spaced apart from each other on the surface of the n-type well. A gate electrode layer 363c is formed on a channel region between p-type impurity regions 363a and 363b with a gate insulating film, not shown, interposed thereunder. Impurity regions 363a and 363d are both connected to power supply potential node 100, and impurity region 363b and gate electrode layer 363c are connected to a node 361. N-type impurity region 363d serves as the backgate bias potential applying electrode of transistor 363, p-type impurity region 363a serves as the source of transistor 363, and p-type impurity region 363b serves as the drain of transistor 363.

High concentration n-type impurity regions 362ab and 362aa, and a high concentration p-type impurity region 362ad are formed spaced apart from each other on the surface of p-type well 21. N-type impurity region 362aa, together with p-type impurity region 362ad, is connected to a node 350. N-type impurity region 362ab is connected to node 361. A gate electrode layer 362ac is formed on the channel region between n-type impurity regions 362aa and 362ab with a gate insulating film, not shown, interposed thereunder. Gate electrode layer 362ac is connected to power supply potential node 100. P-type impurity region 362ad serves as the backgate potential applying electrode of transistor 362ad, n-type impurity region 362aa serves as the source of transistor 362a, and n-type impurity region 362ab serves as the drain of transistor 362a.

High concentration p-type impurity region 202 and an n-type well 2m of higher concentration than in substrate 2a are formed spaced apart from each other on the surface of p-type well 2i. P-type impurity region 202 is connected to ground potential node 200. High concentration p-type impurity regions 343a and 343b, and a high concentration n-type impurity region 343d are formed spaced apart from each other on the surface of n-type well 2m. A gate electrode layer 343c is formed on the channel region between p-type impurity regions 343a and 343b with a gate insulating film, not shown, interposed thereunder. Impurity regions 343a and 343d are both connected to node 350, and gate electrode layer 343c and p-type impurity region 343b is connected to a node 341. N-type impurity region 343d serves as the backgate voltage applying electrode of transistor 343, p-type impurity region 343a serves as the source of transistor 343, and p-type impurity region 343b serves as the drain of transistor 343.

High concentration n-type impurity regions 342aa and 342ab, and a high concentration p-type impurity region 342ad are formed spaced apart from each other on the surface of p-type well 2j. Impurity regions 342aa and 342ad are both connected to ground potential node 200. N-type impurity region 342ab is connected to node 341. A gate electrode layer 342ac is formed on the channel region between n-type impurity regions 342aa and 342ab with a gate insulating film, not shown, interposed thereunder. Gate electrode layer 342ac is connected to node 350. P-type impurity region 342ad serves as the backgate potential applying electrode of transistor 342a, n-type impurity region 342aa serves as the source of transistor 342a, and n-type impurity region 342ab serves as the drain of transistor 342a.

Also in the structure shown in FIG. 6, the triple-well structure is employed, where respective transistors have the same backgate to source voltage, whereby third and fourth circuits 360 and 340 can have the same voltage-current characteristics.

Also in the structure shown in FIG. 6, transistor 363 may be formed on the surface of semiconductor substrate 2a without employing the triple-well structure. In addition, p-type wells 2h, 2l, 2i and 2j are electrically isolated from semiconductor substrate 2a by pn junction therebetween.

Figure 7:
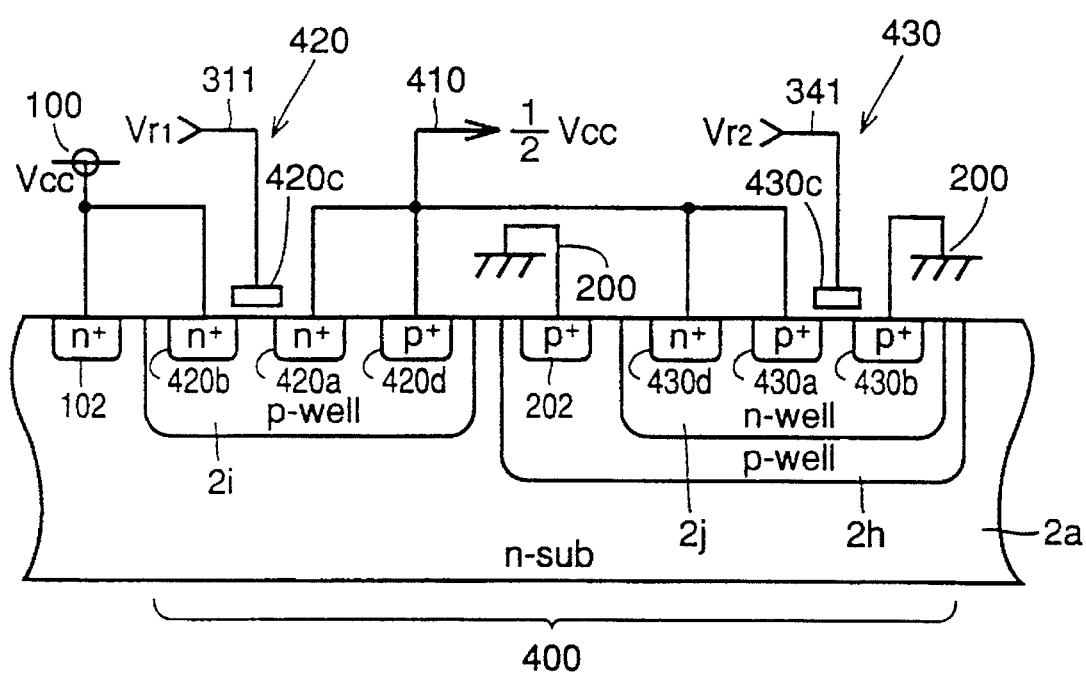
FIG. 7 is a cross sectional view showing another structure of the drive stage shown in FIG. 1.

FIG. 7 is a cross sectional view showing another structure of the drive stage shown in FIG. 1. Also in the structure shown in FIG. 7, drive stage 400 is formed on an n-type semiconductor substrate 2a of low impurity concentration. P-type wells 2h and 2i are formed spaced apart from each other on the surface of n-type semiconductor substrate 2a. P-type wells 2h and 2i are electrically isolated from semiconductor substrate 2a by pn junction therebetween.

High concentration n-type impurity regions 420a and 420b, and a high concentration p-type impurity region 420d are formed spaced apart from each other on the surface of p-type well 2i. Impurity regions 420a and 420d are both connected to a node 410. N-type impurity region 420b is connected to power supply potential node 100. A gate electrode layer 420c is formed on the channel region between n-type impurity regions 420a and 420b with a gate insulating film, not shown, interposed thereunder. Gate electrode layer 420c is supplied with the first reference potential Vr1 through a node 311. N-type impurity region 420b serves as the drain of transistor 420, n-type impurity region 420a serves as the source of transistor 420, and a p-type impurity region 420d serves as backgate voltage applying electrode of transistor 420.

An n-type well 2j of higher concentration than in substrate 2a and a high concentration p-type impurity region 202 is formed spaced apart from each other on the surface of p-type well 2h. P-type impurity region 202 is connected to ground potential node 200. P-type well 2h is biassed to the ground potential through p-type impurity region 202. High concentration p-type impurity regions 430a and 430b, and a high concentration n-type impurity region 430d are formed spaced apart from each other on the surface of n-type well 2j. Impurity regions 430a and 430d are both connected to node 410. P-type impurity region 430e is connected to ground potential node 200. A gate electrode layer 430c is formed on the channel region between p-type impurity regions 430a and 430b with a gate insulating film, not shown, interposed thereunder. Gate electrode layer 430c receives the second reference potential Vr2 through a node 341. P-type impurity region 430a serves as the source of transistor 430, p-type impurity region 430b serves as the drain of transistor 430, and n-type impurity region 430d serves as the backgate voltage applying electrode of transistor 430.

Also in the structures shown in FIGS. 5 to 7, the triple-well structure is employed, where a resistance element of small occupied area having a high resistance value can be formed, as in the structures shown in FIGS. 2 to 4. In addition, the voltage-current characteristics of first and second circuits, as well as the voltage-current characteristics of the third and fourth circuits, can be made identical, whereby a reference potential and an intermediate potential can be generated accurately.

In order for making the threshold voltages of transistor 420 and 430 included in drive stage 400 slightly larger than the threshold voltage of transistor 313 included in first circuit 310, while making the threshold voltage of transistor 430 slightly smaller than the threshold voltage of transistor 343 of the third circuit, the impurity concentration in the channel region of each transistor should be adjusted.

Second Embodiment

Figure 8:
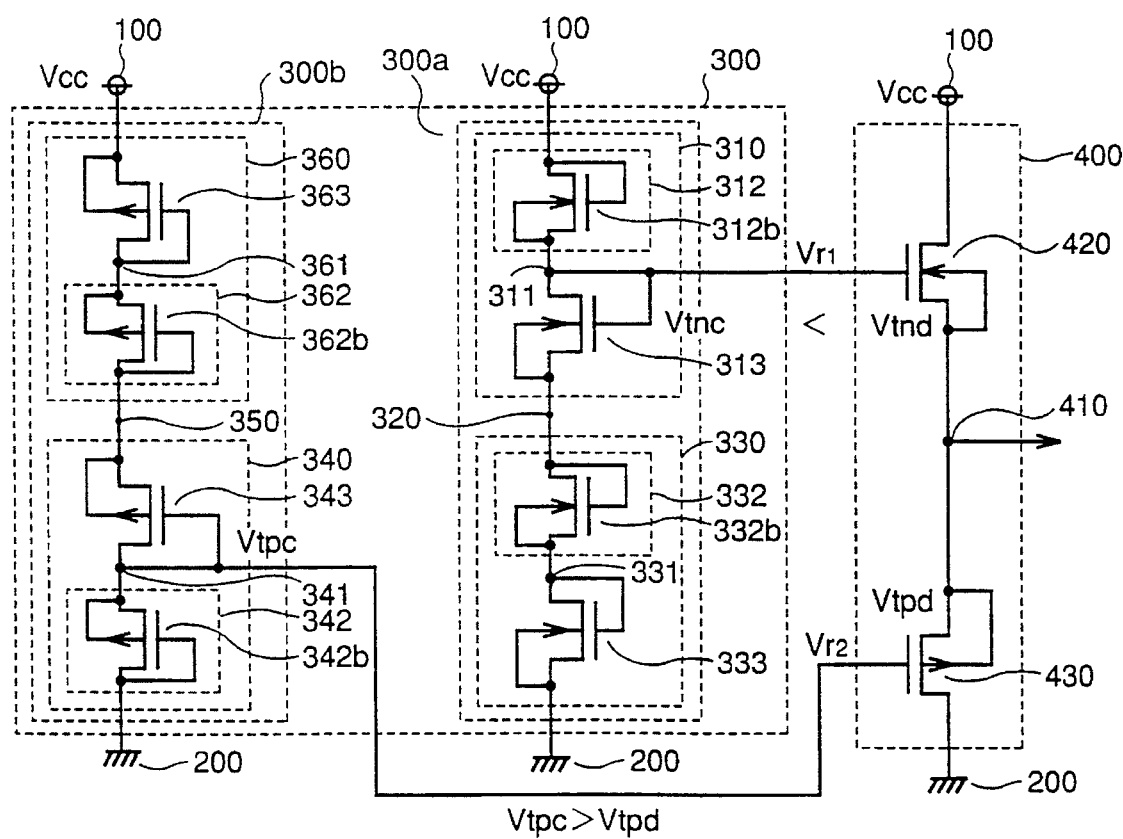
FIG. 8 is a schematic diagram showing the structure of an intermediate potential generating circuit in accordance with a second embodiment of the present invention.

FIG. 8 is a schematic diagram showing the structure of an intermediate potential generator in accordance with a second embodiment of the present invention. In FIG. 8, a first reference potential generating block 300a includes a first circuit 310 and a second circuit 330, as in the first embodiment. First circuit 310 includes a load circuit 312 connected between a power supply potential 100 and a node 311. Load circuit 312, unlike the first embodiment, is constituted of an n-channel MOS transistor 312b. N-channel MOS transistor 312b has its gate and drain connected to power supply potential node 100, and its backgate and source connected to node 311. The channel resistance of transistor 312b constituting load circuit 312 is set to have a resistance value sufficiently large, i.e., not less than 1 MΩ. First circuit 310 further includes an n-channel MOS transistor 313 provided between node 311 and a node 320. Transistor 313 has a threshold voltage Vtnc and a sufficiently large ratio W/L of a gate width W and a gate length L, as in the first embodiment. In transistor 313, a current flow therethrough causes voltage drop of the threshold voltage Vtnc between its gate and source.

Second circuit 330 includes a load circuit 332 connected between nodes 320 and 331 and having a high resistance value. Load circuit 332, unlike the first embodiment, is constituted of an n-channel MOS transistor 332b. Transistor 332b has its gate and drain connected to node 320, and its backgate and source connected to node 331. The channel resistance of transistor 332b is made equal to that of transistor 312b. Transistors 312b and 332b are made in the same size to provide the same voltage-current characteristics.

Second circuit 330, as in the first embodiment, further includes an n-channel MOS transistor 333 connected between node 331 and a ground potential node 200. Transistor 333 has the same voltage-current characteristics as those of transistor 313.

A second reference potential generating block 300*b* includes a third circuit 360 and a fourth circuit 340, as in the first embodiment. Third circuit 360 includes a p-channel MOS transistor 363 connected between power supply potential node 100 and a node 361. Transistor 363 corresponds to transistor 363 in the first embodiment shown in FIG. 1. Third circuit 360 further includes a load circuit 362 connected between nodes 361 and 350, and having a high resistance value. Load circuit 362, unlike in the first embodiment, is constituted of a p-channel MOS transistor 362*b*. Transistor 362*b* has its backgate and source connected to node 361, and its gate and drain connected to node 350.

Fourth circuit 340 includes a p-channel MOS transistor 343 connected between nodes 350 and 341. Transistor 343 has a threshold voltage Vtpc (<0), and has sufficiently large ratio of gate width W to gate length L, causing voltage drop of |Vtpc| between the source and the drain when a current flows therethrough. Fourth circuit 340 further includes a load circuit 342 connected between node 341 and ground potential node 200, and having a high resistance value. Load circuit 342, unlike in the first embodiment, includes a p-channel MOS transistor 342*b*. Transistor 342*b* has its backgate and source connected to node 341, and its gate and drain connected to ground potential node 200.

Drive stage 400 generating an intermediate potential (½) Vcc includes an n-channel MOS transistor 420 and a p-channel MOS transistor 430, as in the first embodiment. A threshold voltage Vtnb of transistor 420 is made slightly larger than the threshold voltage Vtnc of transistor 313, and a threshold voltage Vtpd of transistor 430 is made slightly smaller than the threshold voltage Vtpc of transistor 343.

In the structure shown in FIG. 8, first reference potential generating block 300*a* is constituted of n-channel MOS transistors only. These n-channel MOS transistors can be formed in the same manufacturing process. Accordingly, the voltage-current characteristics of first circuit 310 and second circuit 330 can be made identical more accurately.

Also in second reference potential generating block 300*b*, all components thereof are p-channel MOS transistors. Therefore, the components can be formed in the same manufacturing process, so that the voltage-current characteristics of third and fourth circuits 340 and 360 can be made identical. In particular, since each MOS transistor has its backgate and source connected to each other, each threshold voltage can be made constant, whereby reference voltages Vr1 and Vr2 can be generated accurately. Description will now be made on the operation of the intermediate potential generator shown in FIG. 8.

In first reference potential generating block 300*a*, when a current flows between power supply potential node 100 and ground potential node 200, first circuit 310 and second circuit 330 have the same voltage-current characteristics, whereby the potential of node 320 becomes the intermediate potential (½) Vcc. The ratio W/L of channel width W and channel length L of n-channel MOS transistor 313 is set sufficiently large, so that the gate to source voltage of transistor 313 approximates to the threshold voltage Vtnc. Consequently, the first reference potential Vr1 provided from node 311 is (½) Vcc+Vtnc.

Also in second reference potential generating block 300*b*, third circuit 360 and fourth circuit 340 have the same voltage-current characteristics, whereby the potential of node 350 is the intermediate potential (½) Vcc. The ratio of gate width W to gate length L of transistor 343 is set sufficiently large, so that the gate to source voltage of transistor 343 is approximately the threshold voltage Vtpc (<0). Accordingly, the second reference potential Vr2 provided from node 341 is a potential lower than the intermediate potential (½) Vcc by the absolute value |Vtpc| of the threshold voltage of p-channel MOS transistor 343.

Drive stage 400, as in the first embodiment, provides the intermediate potential (½) Vcc according to the first reference potential Vr1 (=(½) Vcc+Vtnc) and the second reference potential Vr2 (=(½) Vcc+|Vtpc|).

In the structure shown in FIG. 8, even if transistors 312*b* and 332*b* do not have a large resistance, the same effects can be obtained, so long as β, i.e. the ratio W/L of the channel width and the channel length is sufficiently smaller than that of transistors 313 and 333. The same is true for load transistors 362*b* and 342*b*. Also in the structure shown in FIG. 8, since the load circuit has been implemented by an MOS transistor, the layout area thereof can be considerably reduced. In addition, a current flow from power supply potential node 100 to ground potential node 200 can be considerably reduced by decreasing sufficiently W/L of the MOS transistor constituting the load circuit, or increasing sufficiently the channel resistance, whereby power consumption can be reduced.

Figure 9:
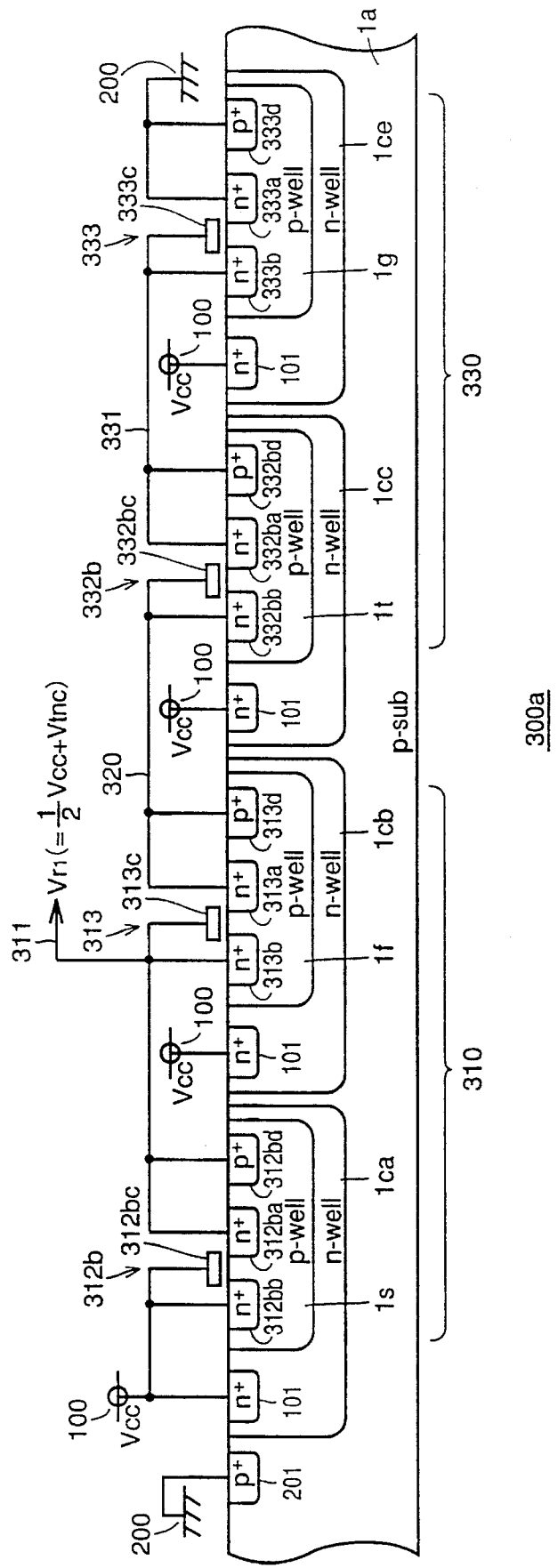
FIG. 9 is a schematic cross sectional view showing the structure of the first reference potential generating block shown in FIG. 8.

FIG. 9 is a schematic cross sectional view showing the first and second circuits shown in FIG. 8. In FIG. 9, first reference potential generating block 300*a* is formed on the surface of a p-type semiconductor substrate 1*a*. First circuit 310 is formed in n-type wells 1*ca* and 1*cb* formed spaced apart from each other on the surface of semiconductor substrate 1*a*. Second circuit 330 is formed in n-type wells 1*cc* and 1*e* formed spaced apart from each other on the surface of substrate 1*a*.

A high concentration n-type impurity region 101 and a p-type well 1*s* of higher concentration than in substrate 1*a* are formed spaced apart from the each other on the surface of n-type well 1*ca*. N-type impurity region 101 is connected to power supply potential node 100. High concentration n-type impurity regions 312*ba* and 312*bb* and a high concentration p-type impurity region 312*bd* are formed spaced apart from each other on the surface of p-type well 1*s*. A gate electrode 312*bc* is formed on the channel region between n-type impurity regions 312*ba* and 312*bb* with a gate insulating film, not shown, interposed thereunder. The gate electrode layer and n-type impurity region 312*bb* are connected to power supply potential node 100. Impurity regions 312*ba* and 312*bd* are connected to node 311. p-type impurity region 312*bd* serves as the backgate voltage applying region of transistor 312*b*, n-type impurity region 312*ba* serves as the source region of transistor 312*b*, and n-type impurity region 312*bb* serves as the drain of transistor 312*b*.

High concentration n-type impurity region 101 and a p-type well 1*f* are formed spaced apart from each other on the surface of n-type impurity region 1*cb*. A transistor 313 is formed in this region. Impurity regions 313*a*, 313*b* and 313*d* formed on the surface of p-type well 1*f* are the same as those shown in FIG. 2.

High concentration n-type impurity region 101 and a p-type well 1*t* are formed spaced apart from each other on the surface of n-type well 1*cc*. Impurity region 101 is connected to power supply potential node 100. High concentration n-type impurity regions 332*ba* and 332*bb*, and a high concentration p-type impurity region 332*bd* are formed spaced apart from each other on the surface of p-type well 1*t*. A gate electrode layer 332*bc* is formed on the channel region between impurity regions 332*ba* and 332*bb* with a gate insulating film, not shown, interposed thereunder. Impurity region 332*bb* and gate electrode layer 332*bc* are connected to node 320. Impurity regions 332*ba* and 332*bd* are connected to node 331. P-type impurity region 332*bd* serves as the backgate voltage applying region of transistor 332*b*, impurity region 332*ba* serves as the source region of transistor 332*b*, and impurity region 332*bb* serves as the drain region of transistor 332*b*.

High concentration n-type impurity region 101 and a p-type well 1*g* are formed spaced apart from each other on the surface of n-type well 1*ce*. P-type well 1*g* is the same as that shown in FIG. 2. Impurity regions 333*a*, 333*b* and 333*d* formed on the surface of p-type well 1*g* constitute a transistor 333.

In the structure shown in FIG. 9, the transistor elements are isolated from each other by a well region, and a well potential of each transistor is made identical to its source potential, whereby the same voltage-current characteristics can be implemented. In addition, all of the transistors are n-channel MOS transistors, whereby they can be fabricated in the same manufacturing process, and transistors 312*b* and 332*b* constituting a load circuit can have the same resistance value.

Figure 10:
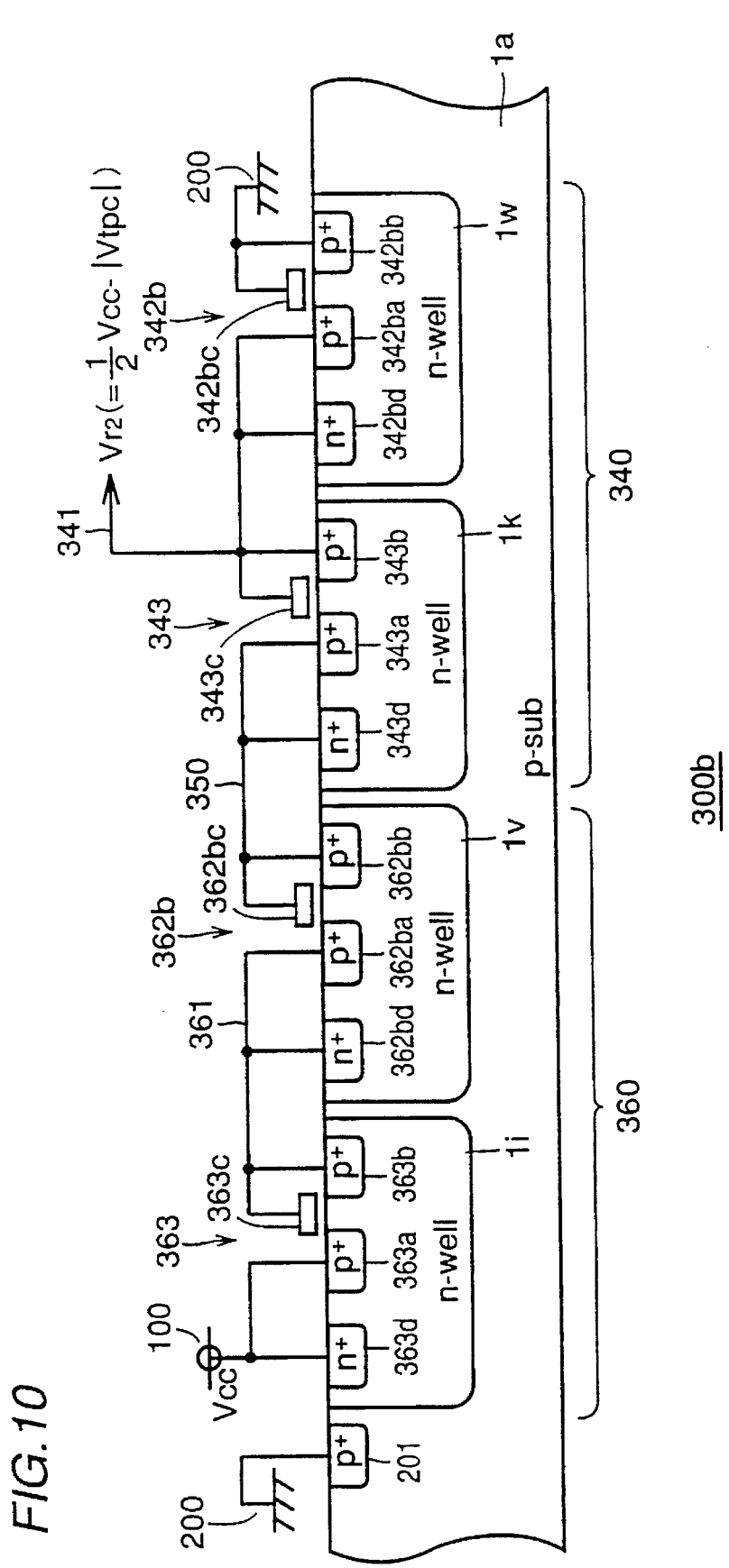
FIG. 10 is a schematic cross sectional view showing the structure of the second reference potential generating block shown in FIG. 8.

FIG. 10 is a schematic cross sectional view showing the structure of the second reference potential generating block shown in FIG. 8. In FIG. 10, n-type wells 1*i*, 1*v*, 1*k* and 1*w* are formed spaced apart from each other on the surface of p-type semiconductor substrate 1*a*. N-type wells 1*i* and 1*k* provide regions for forming transistors 363 and 343. The structure thereof is the same as that shown in FIG. 3, whose corresponding portions have the same reference numerals, and not further described in detail.

High concentration p-type impurity regions 362*ba* and 362*bb*, and a high concentration n-type impurity region 362*bd* are formed spaced apart from each other on the surface of n-type well 1*b*. A gate electrode layer 362*bc* is formed on the channel region between p-type impurity regions 362*ba* and 362*bb* with a gate insulating film, not shown, interposed thereunder. Impurity regions 362*ba* and 362*bd* are connected to node 361. P-type impurity region 362*bb* and gate electrode layer 362*bc* are connected to node 350.

An n-type impurity region 342*bd* and high concentration p-type impurity regions 342*ba* and 342*bb* are formed spaced apart from each other on the surface of n-type well 1*w*. A gate electrode layer 342*bc* is formed on the channel region between p-type impurity regions 342*ba* and 342*bb* with a gate insulating film, not shown, interposed thereunder. Impurity regions 342*ba* and 342*bd* are connected to node 341. Gate electrode layer 342*bc* and impurity region 342*bb* are connected to ground potential node 200. N-type impurity region 342*bd* serves as the backgate voltage applying region of transistor 342*bd*, p-type impurity region 342*ba* serves as the source region of transistor 342*b*, and p-type impurity region 342*bb* serves as the drain region of transistor 342*b*. In the structure shown in FIG. 10, all components in second reference potential generating block 300*b* are p-channel MOS transistors. Accordingly, all the components can be implemented in the same manufacturing process, whereby the manufacturing process can be made simplified. In addition, since the load element each constituted of p-channel MOS transistor, they can be formed to have the same voltage-current characteristics, and thus the same resistance value.

Since the transistors are respectively formed in the well regions separated from each other, they can have the same backgate to source voltages.

In the structure shown in FIGS. 9 and 10, an n-type semiconductor substrate may be employed.

Third Embodiment

Figure 11:
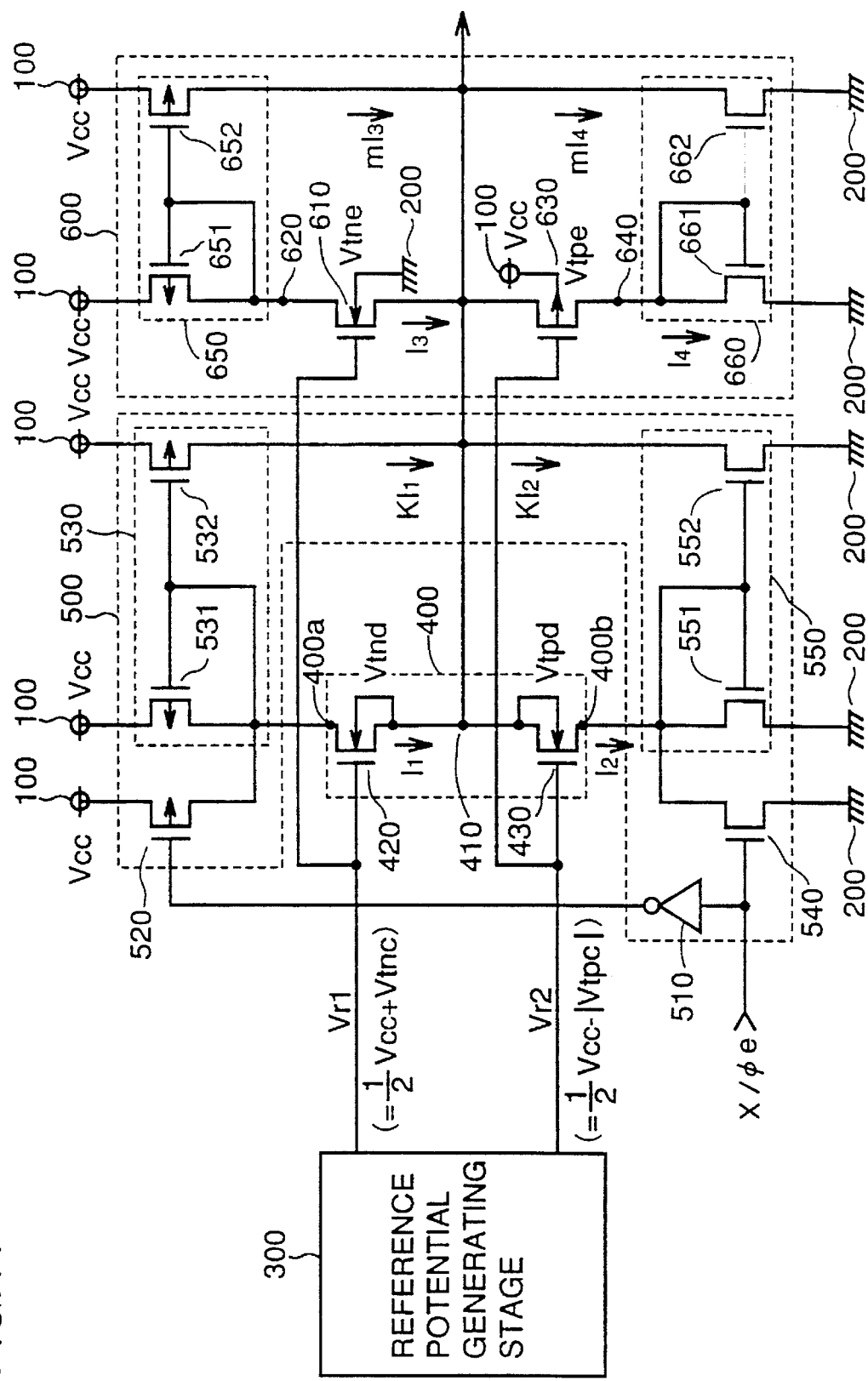
FIG. 11 is a schematic diagram showing the structure of a reference potential generating circuit in accordance with a third embodiment of the present invention.

FIG. 11 is a schematic diagram showing the structure of an intermediate potential generating circuit in accordance with a third embodiment of the present invention. The intermediate potential generating circuit shown in FIG. 11 includes a reference potential generating stage 300 and a drive stage 400, and further includes a first auxiliary drive stage 500 being activated in response to a driving capability switching signal /φe to hold an output node 410 at an intermediate potential, and a second auxiliary drive stage 600 driving the potential of output node 410 to the intermediate potential when the voltage of output node 410 is significantly deviated from the intermediate potential.

First drive stage 500 includes an inverter 510 inverting the driving capability switching signal /φe; a p-channel MOS transistor 520 connected between a power supply potential node 100 and a node 400*a*, and receiving an output of inverter 510 at its gate; an n-channel MOS transistor 540 connected between a node 400*b* and a ground potential node 200, and receiving the driving capability switching signal /φe at its gate; and current mirror circuits 530 and 550 having the mirror ratio k. Drive stage 400 is connected between nodes 400*a* and 400*b*.

Current mirror circuit 530 includes a p-channel MOS transistor 531 connected between power supply potential node 100 and node 400*a*, and having its gate and drain connected together; and a p-channel MOS transistor 532 connected between power supply potential node 100 and output node 410, and having its gate connected to node 400*a*. The mirror ratio k of first current mirror circuit 530 is set to approximately 10.

Current mirror circuit 550 includes an n-channel MOS transistor 551 connected between node 400*b* and ground potential node 200, and having its backgate connected to node 400*b*; and an n-channel MOS transistor 552 connected between output node 410 and ground potential node 200, and having its gate connected to node 400*b*. The mirror ratio k of current mirror circuit 550 is also set to approximately 10.

Second auxiliary drive stage 600 includes an n-channel MOS transistor 610 connected between a node 620 and output node 410, receiving a first reference potential Vr1 at its gate, and having its backgate connected to ground potential node 200; a p-channel MOS transistor 630 connected between nodes 410 and 640, receiving a second reference potential Vr2 at its gate, and having its backgate connected to power supply potential node 100; a current mirror circuit 650 charging output node 410 by reflecting a current flowing through transistor 610 in a current mirror manner; and a current mirror circuit 660 discharging output node 410 by reflecting a current flowing through transistor 630 in a current mirror manner.

Current mirror circuit 650 includes a p-channel MOS transistor 651 connected between power supply potential node 100 and node 620, and having its gate connected to node 620; and a p-channel MOS transistor 652 connected between power supply potential node 100 and output node 410, and having its gate connected to node 620. Current mirror circuit 650 has the mirror ratio m of approximately 10.

Current mirror circuit 660 includes an n-channel MOS transistor 661 connected between node 640 and ground potential node 200, and having its gate connected to node 640; and an n-channel MOS transistor 662 connected between output node 410 and ground potential node 200, and having its gate connected to node 640. Current mirror circuit 660 also has the mirror ratio m of approximately 10. Description will now be made on the operation of the intermediate potential generating circuit shown in FIG. 11.

(i) When the driving capability switching signal /φe is inactivated at a high level:

The first reference potential Vr1 (=(½) Vcc+Vtnc) and the second reference potential Vr2 (=(½) Vcc−|Vtpc|) are provided from reference potential generating stage 300. In this state, the output of inverter 510 is at a low level of the ground potential level, so that p-channel MOS transistor 520 is brought into the ON state, thereby charging node 400a to the power supply potential Vcc level.

N-channel MOS transistor 540 receives a potential at a high level of the power supply potential Vcc level at its gate, so as to set node 400b to a ground potential level. Since node 400a is at the power supply potential Vcc level, transistors 531 and 532 included in current mirror circuit 530 are in the OFF state. Similarly, transistors 551 and 552 which are components of current mirror circuit 550 are in the OFF state. Accordingly, in this state, first auxiliary drive stage 500 does not operate, while output drive stage 400 drives the output node, as in the first and second embodiments.

When the potential of output node 410 is between (½) Vcc−|Vtnd−Vtnc| and (½) Vcc+|Vtpd−Vtpc|, i.e, approximately the intermediate potential, transistors 420 and 430 included in drive stage 400 are both in the OFF state.

In this state, voltages which approximate to Vtnc and −|Vtpc|, are applied between the gate and the source of each of n-channel MOS transistors 420 and 430 in drive stage 400. The backgate to source voltage in each of transistors 420 and 430 is 0 V. In this state, a subthreshold current Is1 of e.g. approximately 10 nA flows through transistors 420 and 430.

A threshold voltage Vtne of transistor 610 included in second auxiliary drive stage 600 is set higher than the threshold voltage Vtnd of transistor 420, and a threshold voltage Vtpe of transistor 630 is set lower than the threshold voltage Vtpd of transistor 430.

The gate of transistor 610 is supplied with the first reference potential Vr1, and the gate of transistor 630 is supplied with second reference potential Vr2. The voltage of approximately Vtnc is applied also between the gate and the source of transistor 630, as well as the voltage of −|Vtpc| is applied also between the gate and the source of transistor 630. The backgate of transistor 610 is connected to ground potential node 200, and the backgate of transistor 630 is connected to power supply potential node 100. Accordingly, transistors 610 and 630 are respectively supplied with voltages of approximately −(½) Vcc and (½) Vcc between the backgate and the source thereof. In this state, the conductance of each of the threshold voltages of transistors 610 and 630 becomes small because of backgate bias effect, so that a sub-threshold current Is2 (<<Is1) of approximately 10 pA, for example, flows. The sub-threshold current Is2 flowing through transistors 610 and 630 is mirror-reflected by current mirror circuits 650 and 660, so that a current m·Is flows through transistor 652 from power supply potential node 100 to output node 410, while a current m·Is2 flows through transistor 662 from output node 410 to ground potential node 220. Accordingly, power consumption at a steady state is described by:

Is1+(1+m)·Is2 (≈Is1)

When the potential of output node 410 drops from the intermediate potential (½) Vcc by a potential not less than |Vtnd−Vtnc| and not more than |Vtne−Vtnc|, transistor 420 in drive stage 400 is brought into the ON state, while transistor 430 is held in the OFF state.

A current I1 flows through transistors 520 and 420 from power supply potential node 100 to output node 410, thereby supplementing charges to raise the potential of output node 410. At this time, transistor 610 in second auxiliary drive stage 600 is still in the OFF state, and transistor 630 is also held in the OFF state. Therefore, charges are not supplied to output node 410 by stage 600.

When the potential of output node 410 rises from the intermediate potential (½) Vcc by a potential not less than |Vtpd−Vtpc| and not more than |Vtpd−Vtpc|, transistor 430 is brought into the ON state, and transistor 420 is brought into the OFF state in drive stage 400. A current I2 flows through transistors 430 and 540 from output node 410 to ground potential node 200, so that the potential of output node 410 drops through extraction of charges of output node 410. Also in this state, since the threshold voltage Vtpe of transistor 630 in second auxiliary drive stage 600 is made lower than the threshold voltage Vtpd of transistor 430, transistor 630 is held in the OFF state. Accordingly, charges are not extracted from output node 410 in second auxiliary drive stage 600.

When the potential of output node 410 drops from the intermediate potential (½) Vcc by a potential not less than |Vtne−Vtnc|, not only transistor 420 in drive stage 400, but also transistor 610 is brought into the ON state. Output node 410 is supplied with a current not only through transistors 520 and 420, but through current-mirror circuit 650. More specifically, when transistor 610 is rendered ON, a current I3 flows from power supply potential node 100 through transistors 651 and 610 to output node 410. Current mirror circuit 650 has the mirror ratio m, so that a current of m·I3 flows from power supply potential node 100 to output node 410 through transistor 652. Consequently, the potential of output node 410 rapidly rises.

When the potential of output node 410 rises from the intermediate potential (½) Vcc by |Vtpd−Vtpc| or more, not only transistor 430 in drive stage 400, but also transistor 630 included in second auxiliary drive stage 600 is brought into the ON state. A current I4 flows through transistor 630 and transistor 661 included in current mirror circuit 660, while a current m·I4 flows through transistor 662 from output node 410 to ground potential node 200. Consequently, the potential of output node 410 rapidly drops.

(ii) When the driving capability switching signal /φe is activated (at a low level):

In this state, the output of inverter 510 is at a high level, and transistors 520 and 540 are brought into the OFF state. Current mirror circuits 530 and 550 are brought into the operable state.

When the potential of output node 410 approximate to the intermediate potential, the sub-threshold current Is1 flows through transistors 420 and 430, and responsively, the mirror current k·Is1 flows from power supply potential node 100 to ground potential node 200 via transistors 532 and 552. The sub-threshold current Is2 and the mirror current m·Is2 flow in second auxiliary drive stage 600. Accordingly, power consumption in a steady state will be represented by:

(1+k)·Is1+(1+m)·Is2≈(1+k)·Is1

When the potential of output node 410 drops from the intermediate potential (½) Vcc by a potential not less than |Vtnd−Vtnc| and not more than |Vtne−Vtnc|, transistor 420 included in drive stage 400 is brought into the ON state, causing the current I1 to flow. A current k·I1 flows through transistor 532 from power supply potential node 100 to output node 410 according to the function of current mirror circuit 530. Transistors 610 and 630 in second auxiliary drive stage 600 are in the OFF state, so that output node 410 is charged by a current of $(1+k) \cdot I1$, causing the potential thereof to rise.

When the potential of output node 410 rises from the intermediate potential (½) Vcc by a potential not less than |Vtpd−Vtpc| and not more than |Vtpe−Vtpc|, transistor 420 is brought into the OFF state, and transistor 430 is brought into the ON state. In this case, a mirror current $k \cdot I2$ flows from output node 410 to ground potential node 200 through transistor 552 due to the function of current mirror circuit 550, so that output node 410 is discharged by a current of $(1+k) \cdot I2$, causing the potential thereof to drop. In this state, transistors 610 and 630 in second auxiliary drive stage 600 are still in the OFF state.

When the potential of output node 410 drops from the intermediate potential (½) Vcc by a potential not less than |Vtne−Vtnc|, output node 410 is charged by drive stage 400 and current mirror circuit 530, and transistor 610 included in second auxiliary drive stage 600 is rendered ON, whereby output node 410 is charged by current mirror circuit 650. When the current I3 flows through transistor 610, the current $m \cdot I3$ flows through transistor 652 from power supply potential node 100 to output node 410. Accordingly, output node 410 is charged by a current of $(1+k) \cdot I1+(1+m) \cdot I3$, causing the potential thereof to rise rapidly.

When the potential of output node 410 rises from the intermediate potential (½) Vcc by |Vtpe−Vtpc|, or more output node 410 is discharged by transistor 430 included in drive stage 400 and current mirror circuit 550. In this case, since transistor 630 is rendered ON, output node 410 is discharged also by current mirror circuit 660. When the current I4 flows through transistor 630, the current $m \cdot I4$ flows from output node 410 through transistor 662 to ground potential node 200. That is, a current of $(1+k) \cdot I2+(1+m) \cdot I4$ flows from output node 410 to ground potential node 200. Consequently, the potential of output node 410 drops rapidly.

With the driving capability switching signal /φe being activated (at a low level), current mirror circuits 530 and 550 operate. Therefore the current driving capability is made larger, by the amount of $k \cdot I1$ and $k \cdot I2$ at the time of charging and the time of discharging, than that with the driving capability switching signal /φe being inactivated (at a high level).

In addition, the backgate to source voltage of transistor 610 included in second auxiliary drive stage 600 is lower than that of transistor 420 included in drive stage 400, so that the backgate bias effect on transistor 610 is larger than that on transistor 420, enabling a sub-threshold current to be reduced considerably (the sub-threshold current Is generally varies exponentially with a gate voltage Vgs which varies according to a backgate voltage).

Since the backgate to source voltage of p-channel MOS transistor 630 is higher than that of p-channel MOS transistor 430, the sub-threshold current of transistor 630 is much smaller than that of transistor 430. For example, in the case of m=10, approximately, not more than $\frac{1}{10}$ or less of the current Is1 consumed by drive stage 400 can be set to be consumed in second auxiliary drive stage 600.

Moreover, when change in the potential of output node 410 is small, current consumption at a steady state can be reduced by inactivating the driving capability switching signal /φe, from current consumption $(1+k) \cdot Is1+(1+m) \cdot Is2 (\approx (1+k) \approx Is1)$ at the time of the driving capability switching signal /φe being activated, to $Is1+(1+m) \cdot Is2(=Is1)$. Consequently, current consumption can be reduced considerably compared to the intermediate potential generating circuit without a function of switching driving capability.

For example, when the driving capability switching signal /φe is activated for 5 sec during 10 sec where k=m=10, Is1=10 nA, and Is2=10 pA, the quantity of power consumption is:

$$5 \text{ sec} \cdot (10n+(1+10) \cdot 10p)+5 \text{ sec} \cdot ((1+10) \cdot 10n+(1+10) \cdot 10p) \approx 600 \text{ nA} \cdot \text{sec}$$

On the other hand, without a function of switching driving capability, the quantity of power consumption is:

$$10 \text{ sec} \cdot ((1+10) \cdot 10n+(1+10) \cdot 10p) \approx 1.1 \text{ μA} \cdot \text{sec}.$$

As a result, power consumption of 500 nA·sec can be reduced by selectively activating the driving capability switching signal /φe.

Embodiment 4

Figure 12:
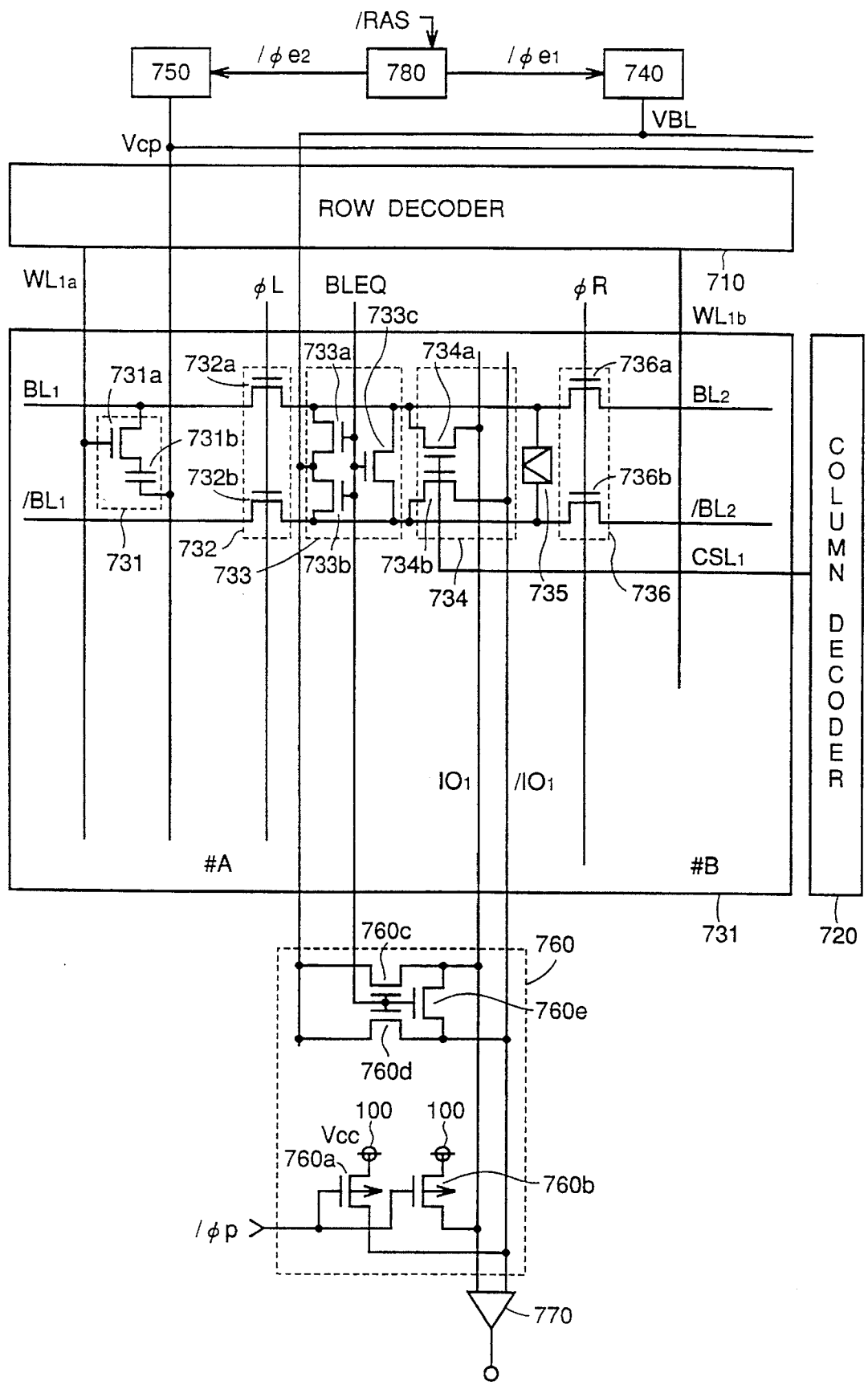
FIG. 12 is a schematic diagram showing the main components of a DRAM employing an intermediate potential generator in accordance with the present invention.

FIG. 12 is a schematic diagram showing the structure of the main components in a semiconductor memory device including the intermediate potential generating circuit. In FIG. 12, the structure is shown where the intermediate potential generating circuit is applied to a dynamic random access memory (DRAM). In FIG. 12, the DRAM includes a memory cell array including memory cells 731 arranged in a matrix of rows and coles. Memory cell 731 includes a memory cell capacitor 731b for storing information and an access transistor 731a for accessing memory cell capacitor 731b. The memory cell array includes two memory cell blocks #A and #B. Memory block #A includes a bit line pair BL and /BL corresponding to each column of memory cells, and a word line WL corresponding to each row of memory cells. In FIG. 12, a pair of bit lines BL1 and /BL1 and a word line WL1a are shown. Similarly, memory block #B includes a bit line pair BL and /BL corresponding to each column of memory cells, and a word line WL corresponding to each row of memory cells. In FIG. 12, a bit line pair BL2 and /BL2 and a word line WL1b are shown in memory block #B.

For bit line pair BL1 and /BL1, an IO control circuit 732 being conductive in response to a memory cell block select signal φL is provided. Also in memory block #B, an IO control circuit 736 being conductive in response to a block select signal φR is provided for bit line pair BL2 and /BL2. IO control circuit 732 includes n-channel MOS transistors 732a and 732b corresponding to bit lines BL1 and /BL1. IO control circuit 736 includes n-channel MOS transistor 736a and 736b corresponding to bit lines BL2 and /BL2. A sense amplifier 735 is provided between IO control circuits 732 and 736. Sense amplifier 735 differentially amplifies the potentials of its sense nodes, namely, nodes connected to bit lines BL1, /BL1 or BL2, /BL2, at the time of activation.

An equalize/precharge circuit 733, which is activated in response to a bit line equalize signal BLEQ is provided commonly for bit line pairs BL1 and /BL1, and BL2 and BL2, to transmit an intermediate potential VBL to each bit line, and also to equalize the potential of the corresponding bit line. Equalize/precharge circuit 733 includes an n-channel MOS transistor 733a for transmitting the intermediate potential VBL to bit lines BL1 and BL2, an n-channel MOS transistor 733b for transmitting the intermediate potential VBL to bit lines /BL1 and /BL2, and an n-channel MOS transistor 733c for equalizing the potentials of bit lines BL1, /BL1, BL2, /BL2.

Adjacent to sense amplifier 735, an IO gate 734 is provided which is rendered conductive in response to a signal on a column select line CSL from column decoder 720 to connect the sense nodes of sense amplifier 735 to internal data bus lines IO1 and /IO1. IO gate 734 includes an n-channel MOS transistor 734a for connecting bit line BL1 (or BL2) to internal data bus line IO1, and an n-channel MOS transistor 734b for connecting complimentary bit line /BL1 (or /BL2) to complimentary internal data bus line /IO1.

The DRAM further includes a row decoder 710 decoding an applied row address signal to drive word line WL corresponding to the row address signal to the selected state; column decoder 720 decoding an applied column address signal to drive a column select line CSL corresponding to the column address to the selected state; an IO line precharge circuit 760 precharging/equalizing the potentials of internal data bus lines IO1 and /IO1 to the intermediate potential, while reducing potential swing of internal data bus lines IO1 and /IO1 in reading data; and an output buffer 770 differentially amplifying the potentials of internal data bus lines IO1 and /IO1 to provide data.

IO line precharge circuit 760 includes n-channel MOS transistors 760c, 760e and 760d responsive to the equalize signal BLEQ for precharging and equalizing internal data bus lines IO1 and /IO1 to the intermediate potential VBL, and p-channel MOS transistors 760a and 760b responsive to a precharge signal /φp for precharging internal data bus lines IO1 and/IO1 to the power supply potential Vcc.

The DRAM further includes a driving capability switching signal generating circuit 780 being activated in response to a row address strobe signal /RAS to generate driving capability switching signals /φe1 and /φe2 at predetermined timings; a first intermediate potential generating circuit 740 responsive to the driving capability switching signal /φe1 for having its driving capability switched to generate the intermediate potential VBL; and a second intermediate potential generating circuit 750 responsive to the driving capability switching signal φe2 for having its driving capability switched to generate the intermediate potential Vcp. Intermediate potential generating circuits 740 and 750 have the same structure as that of the intermediate potential generating circuit shown in FIG. 11. The intermediate potential VBL from intermediate potential generating circuit 740 is used for precharging a bit line and an internal data bus line. The intermediate potential Vcp from intermediate potential generating circuit 750 is applied to a cell plate electrode of memory cell capacitor 731b included in memory cell 731. By setting of the cell plate potential of memory cell capacitor 731b to an intermediate potential (½) Vcc between the power supply potential Vcc and the ground potential GND, the absolute values of a total of stored charges in the memory cell capacitor in high level data writing and in low level data writing to memory cell 731 can be made equal to each other.

Figure 13:
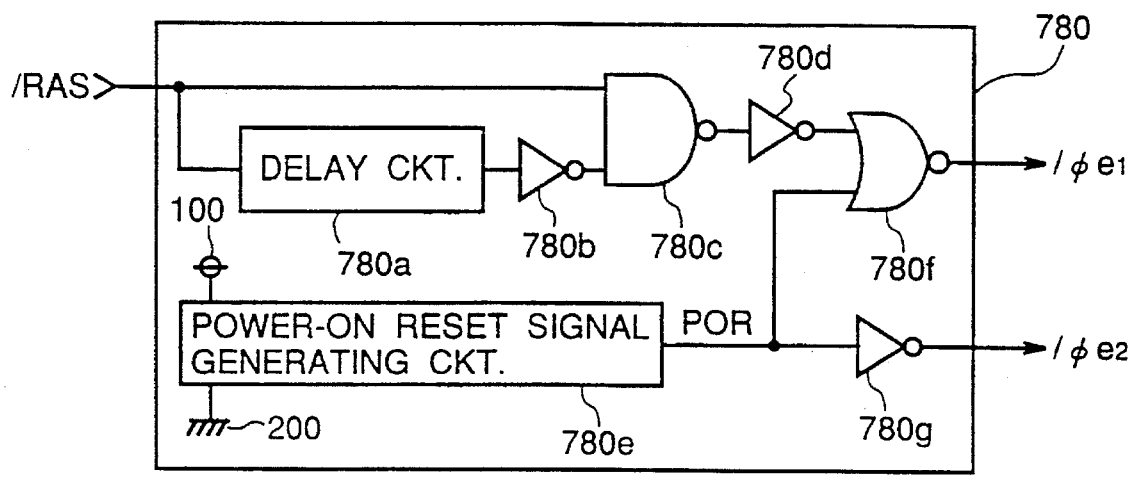
FIG. 13 is a schematic diagram showing the structure of the driving capability switching signal generating circuit shown in FIG. 12.

FIG. 13 is a schematic diagram showing the structure of the driving capability switching signal generating circuit shown in FIG. 12. In FIG. 13, driving capability switching signal generating circuit 780 includes a delay circuit 780a delaying the row address strobe signal /RAS by a predetermined time period; an inverter 780b inverting an output of delay circuit 780a; a two-input NAND gate 780c receiving the row address strobe signal /RAS and the output of inverter 780b; an inverter 780d inverting an output of NAND gate 780c; a power-on reset signal generating circuit 780e generating an one-shot pulse signal for a predetermined time period upon application of power supply; a two-input NOR circuit 780f receiving a power-on reset signal POR from power-on reset signal generating circuit 780e and an output from inverter 780d; and an inverter 780g inverting the power-on reset signal POR.

Figure 14:
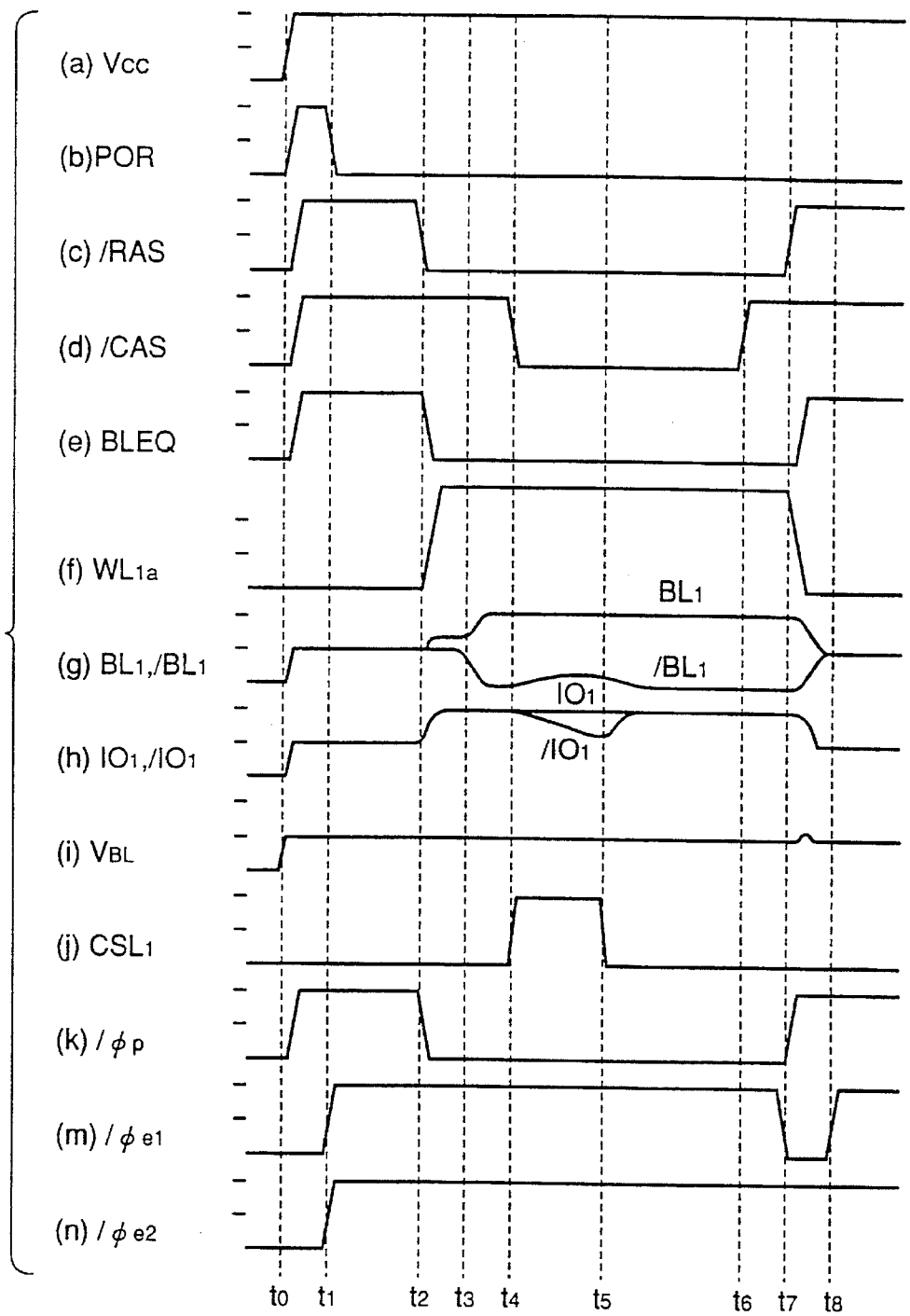
FIG. 14 is a waveform diagram of signals showing the operation of the circuits shown in FIGS. 12 and 13.
Figure 15:
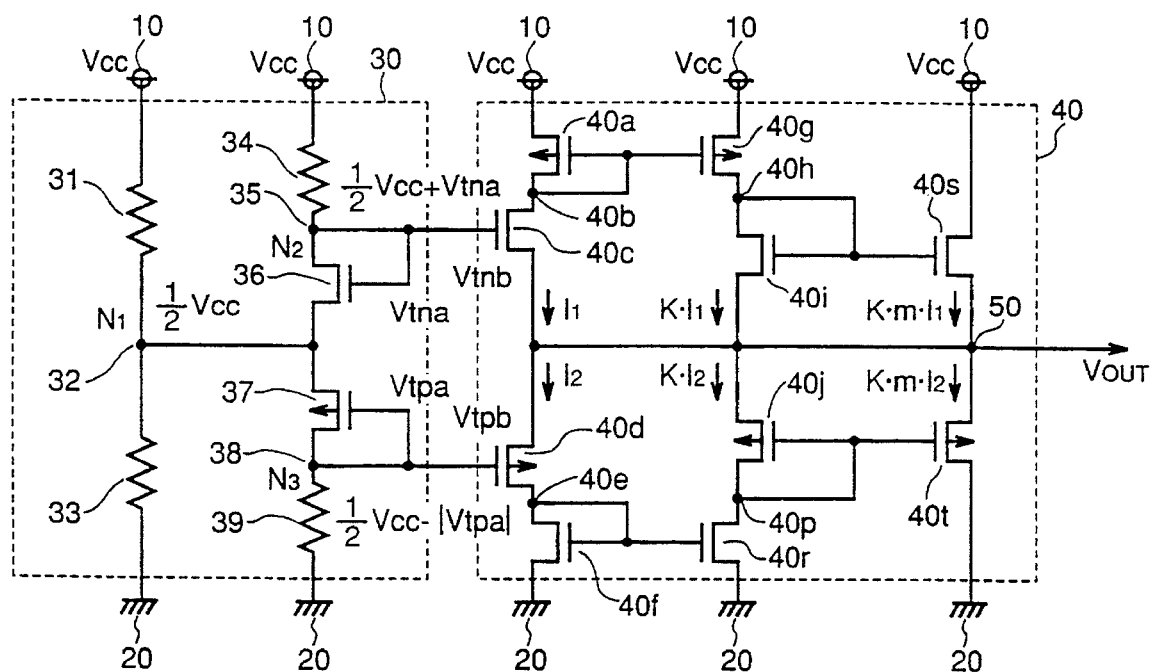
FIG. 15 is a schematic diagram showing the structure of a conventional intermediate potential generating circuit.
Figure 16:
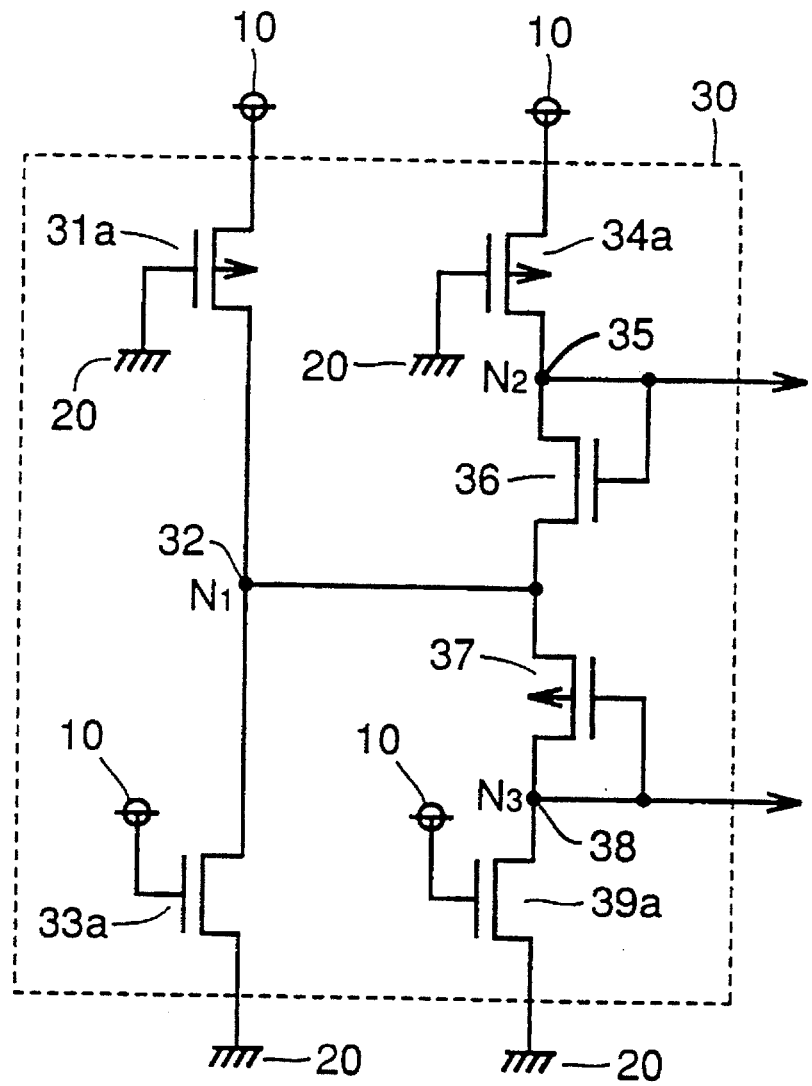
FIG. 16 is a schematic diagram showing modification of the conventional intermediate potential generating circuit.

The first driving capability switching signal /φe1 is generated from NOR gate 780f, and the second driving capability switching signal /φe2 is generated from inverter 780g. The DRAM shown in FIG. 12 has a shared sense amplifier structure in which sense amplifier 735 is shared by memory cell blocks #A and #B. In operation, one memory block including a selected word line is connected to sense amplifier 735, while the other memory block is disconnected from the sense amplifier. Description will now be given on the operation of the circuit shown in FIGS. 12 and 13, with reference to FIG. 14. In the following description, it is assumed that high level data is read from memory cell 731 connected to a selected word line.

At time t0, when the power supply potential Vcc is applied to power supply potential node 100, the potential of power supply potential node 100 rises from the ground potential. Responsively, power-on reset signal generating circuit 780e shown in FIG. 13 generates the power-on reset signal POR which is at a high level for a predetermined period. The power-on reset signal POR is held at a high level till time t1. Upon application of the power supply, a control signal of the DRAM rises to a high level. When the power-on reset signal POR is at a high level, the driving capability switching signal /φe1 provided from NOR gate 780 is fixed to a low level, while the driving capability switching signal /φe2 provided from inverter 780g is fixed to a low level. The driving capability switching signals /φe1 and /φe2 are provided to intermediate potential generating circuits 740 and 750 shown in FIG. 12. The driving capability switching signals /φe1 and /φe2 are in the active state, so that intermediate potential generating circuits 740 and 750 operate with large driving capability, thereby generating the stable intermediate potentials VBL and Vcp rapidly after application of power supply.

At the time t1, the power-on reset signal POR becomes low, and the output /φe2 of inverter 780g becomes inactive at a high level. The power-on reset signal POR is at a high level for a predetermined period only on application of power supply, and thereafter is held at a low level. Accordingly, the driving capability switching signal /φe2 thereafter is held inactive at a high level. Intermediate potential generating circuit 750 generating the cell plate potential Vcp of the memory cell capacitor generates the intermediate potential Vcp, with its driving capability made small.

At the time t1, the row address strobe signal /RAS is at a high level. The delayed row address strobe signal /RAS provided from delay circuit 780a is also at a high level, and the output from inverter 780b is at a low level. The output of NAND circuit 780c attains a high level according to the signal at a low level from inverter 780b, and the output of inverter 780d attains a low level.

NOR gate 780f receives the power-on reset signal POR at a low level and the signal at a low level from inverter 780d, to provide the driving capability switching signal /φe1 at a high level. This makes driving capability of first intermediate potential generating circuit 740 shown in FIG. 12 small, thereby reducing power consumption at a steady state. Driving capability of second intermediate potential 750 is also made small by the driving capability switching signal /φe2 at a high level, whereby power consumption is reduced.

From the time t1 to time t2, the DRAM is in the standby state. During this period, the bit line equalize signal BLEQ is at a high level, and bit lines BL and /BL, and internal data bus lines IO1 and /IO1 are precharged to the intermediate potential VBL. The precharge signal /φp attains a high level. The bit line equalize signal BLEQ and the precharge signal /φp are generated in response to the row address strobe signal /RAS from a control circuit, not shown.

At the time t2, when the row address strobe signal RAS is activated, that is, attains a low level, the bit line equalize signal BLEQ attains a low level, whereby the precharge/ equalize operation for bit lines BL and /BL, and internal data bus lines IO1 and /IO1 is completed.

When the precharge signal /φp attains a low level, transistors 760a and 760b in precharge circuit 760 are brought into the ON state, whereby internal data bus lines IO1 and /IO1 are precharged to the power supply potential Vcc level.

In response to activation of the row address strobe signal /RAS, a row address signal is strobed, and provided to row decoder 710. Row decoder 710 decodes the applied row address signal to raise the potential of word line WL1a.

A block selecting circuit decodes, e.g., the most significant bit of the row address signal to fall, either of the signals φL and φR to a low level. Since word line WL1a is included in memory block #A, the signal φR which has been at a high level till then falls to a low level, so that bit lines BL2 and /BL2 are disconnected from sense amplifier 735. The signal φL is held at a high level. In the precharge state (standby state), the signals φL and φR are both at a high level, so that bit lines BL1 and /BL1, and BL2 and /BL2 are precharged to the intermediate potential VBL by bit line equalize/ precharge circuit 733.

On raising the potential of word line WL1a, storage data in memory cell 731 connected to word line WL1a is transmitted onto a bit line. Memory cell 731 connected to bit line BL1 and word line WL1a stores data at a high level, whereby the potential of bit line BL1 slightly rises. The potential of bit line /BL1 holds the intermediate potential VBL. At time t3, sense amplifier 735 is activated, so that the potentials of bit lines BL1 and /BL1 are differentially amplified.

At time t4, a column address strobe signal /CAS falls to a low level, so that column selecting operation is started. In response to fall of the column address strobe signal /CAS, a column address signal is strobed, to be decoded by column decoder 720. A column select signal CSL1 from column decoder 720 rises to a high level, so that n-channel MOS transistors 734a and 734b included in IO gate 734 are conducted, whereby bit lines BL1 and /BL1 are connected to internal data bus lines IO1 and /IO1 through IO gate 734. Since internal data bus lines IO1 and /IO1 are precharged to the power supply potential Vcc, the potential of complementary internal data bus line /IO1 slightly drops according to the potentials of bit lines BL1 and /BL1. At this time, the potential of bit line BL1 slightly rises due to potential supply from internal data bus line /IO1. The potential difference between internal data bus lines IO1 and /IO1 is amplified by a preamplifier 770, and provided therefrom.

At time t5, the column select signal CSL1 falls to a low level, rendering IO gate 734 non-conductive, whereby bit lines BL1 and /BL1 are disconnected from internal data bus lines IO1 and /IO1. Consequently, the potentials of internal data bus lines IO1 and /IO1 are returned to the power supply potential Vcc level again by transistors 760a and 760b. The potentials of bit lines BL1 and /BL1 are returned to the power supply potential Vcc level and the ground potential level by sense amplifier 735. Data can thus be rewritten (restored) to memory cell 731.

At time t6, the column address strobe signal /CAS is inactivated (attains a high level), and subsequently the row address strobe signal /RAS is inactivated at time t7. In response to inactivation of the row address strobe signal /RAS, the precharge signal /φp attains a high level, so that transistors 760a and 760b included in precharge circuit 760 are brought into the OFF state.

Subsequently, the bit line equalize signal BLEQ attains a high level, so that bit line precharge/equalize circuit 733 operates to precharge and equalize bit lines BL1 and /BL1 to the intermediate potential VBL. In precharge circuit 760, internal data bus lines IO1 and /IO1 are precharged/equalized to the intermediate potential VBL by transistors 760c and 760d.

In this precharge operation, since internal data bus lines IO1, and /IO1 which has been at the power supply potential Vcc are precharged to the intermediate potential VBL, the intermediate potential VBL generated from intermediate potential generating circuit 740 slightly rises. In driving capability switching signal generating circuit 780 shown in FIG. 13, however, when the row address strobe signal /RAS rises to a high level, the output of inverter 780b is still at a high level, so that the output of NAND gate 780c is at a low level, and thus the output of inverter 780d is at a high level. Responsively, the driving capability switching signal /φe1 attains a low level, so that intermediate potential generating circuit 740 restores the slightly risen intermediate potential VBL to the intermediate potential (½) Vcc level, with its large driving capability. After a delay time period of delay circuit 780a, the driving capability switching signal /φe1 attains a high level again.

In the DRAM, since the driving capability of intermediate potential generating circuit 740 is made large only for a predetermined period during inactivation of the row address strobe signal /RAS, unduly current consumption can be prevented.

At time t7, the potential of word line WL1a falls to a low level, so that transistor 731a in memory cell 731 is rendered OFF, and thereafter, the bit line equalize/precharge signal BLEQ is brought at a high level. The purpose for word line WL1a being boosted to a higher potential level than the power supply potential Vcc at the time of selection, is to prevent threshold voltage loss in access transistor 731a and write data at the power supply potential Vcc level to memory cell capacitor 731b, and to drive word line WL1a to the selected state at a high speed.

In the fourth embodiment, second intermediate potential generating circuit 750 receives the driving capability switching signal /φe2. However, when the row address strobe signal /RAS rises to a high level, the intermediate potential Vcp provided from intermediate potential generating circuit 750 receives noise due to precharge of a bit line and an internal data bus line to the intermediate potential (½) Vcc. Thus, intermediate potential generating circuit 750 may receive the first driving capability switching signal /φe1 instead of the driving capability switch signal /φe2.

Although precharge/equalize potential supply and memory cell capacitor cell plate potential supply in a DRAM have been described as an application of an intermediate potential generating circuit, the intermediate potential generating circuit of the present invention may be employed for generation of a reference voltage for determining a high level/a low level of an input signal, for example.

The meritorious effects of the present invention can be summarized as in the following.

(1) Since a load element required for the intermediate potential generating circuit is formed of MOS transistor, a load circuit of small layout area and low power consumption can be implemented. In addition, formation of the load transistor on a substrate of triple-well structure enables accurate generation of an intermediate potential.

(2) Since driving capability of the intermediate potential generating circuit is switched by a driving capability switching signal, the driving capability can be reduced at a steady state, implementing low power consumption.

(3) Auxiliary drive means is provided which operates with small power consumption in a steady state and rapidly restores the intermediate potential to a desired value when the intermediate potential is largely deviated from the desired value.

(4) Application of the intermediate potential generating circuit to a DRAM enables stable generation of precharge-equalize voltage for a bit line and internal data line and a memory cell capacitor cell plate voltage with low power consumption and small occupied area, thereby implementing a DRAM of stable operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A device for generating an intermediate potential between a first potential and a second potential, comprising:

first reference potential generating means coupled between a node receiving said first potential and a node receiving said second potential, for generating a first reference potential higher than said intermediate potential, said first reference potential generating means including insulated gate type field effect transistors of a first conductivity type connected in series to each other, and formed to have substantially the same voltage-current characteristics;

second reference potential generating means connected between the node receiving said first potential and the node receiving said second potential, for generating a second reference potential lower than said intermediate potential, said second reference potential generating means including insulated gate type field effect transistors of a second conductivity type formed to have substantially the same voltage-current characteristics, and connected in series to each other;

a first output driving insulated gate type field effect transistor connected between the node receiving said first potential and an output node, for transmitting said first reference potential to said output node in a source follower manner in which a potential at a source of an insulated gate field effect transistor is represented by a function of a potential at a gate thereof; and a second output driving insulated gate type field effect transistor connected between said output node and the node receiving said second potential, for transmitting said second reference potential to said output node in the source follower manner, wherein in a triple-well structure having a first well region of the second conductivity type formed on a surface of a semiconductor substrate of the first conductivity type and a second well region of the first conductivity type formed on a surface of said first well region, one of said first and second field effect transistors is formed in said second well region.

2. A device for generating an intermediate potential between a first potential and a second potential, comprising:

first reference potential generating means coupled between a node receiving said first potential and a node receiving said second potential, for generating a first reference potential higher than said intermediate potential, said first reference potential generating means including insulated gate type field effect transistors of a first conductivity type connected in series to each other, and formed to have substantially the same voltage-current characteristics;

second reference potential generating means connected between the node receiving said first potential and the node receiving said second potential, for generating a second reference potential lower than said intermediate potential, said second reference potential generating means including insulated gate type field effect transistors of a second conductivity type formed to have substantially the same voltage-current characteristics, and connected in series to each other;

a first output driving insulated gate type field effect transistor connected between the node receiving said first potential and an output node, for transmitting said first reference potential to said output node in a source follower manner in which a potential at a source of an insulated gate field effect transistor is represented by a function of a potential at a gate thereof; and a second output driving insulated gate type field effect transistor connected between said output node and the node receiving said second potential, for transmitting said second reference potential to said output node in the source follower manner, wherein said first reference potential generating means includes a p-channel insulated gate type field effect transistor having one conduction terminal and a backgate connected to the node receiving said first potential, other conduction terminal connected to a first node providing said first reference potential, and a gate connected to a second node, an n-channel insulated gate type field effect transistor having one conduction terminal and a gate connected to said first node, and other conduction terminal connected to said second node, and having a threshold voltage larger than the threshold voltage of said first output driving field effect transistor, another p-channel insulated gate type field effect transistor having one conduction terminal and a backgate connected to said second node, a gate connected to receive said second potential, and other conduction terminal connected to a third node, and another n-channel insulated gate type field effect transistor having one conduction terminal and a gate connected to said third node, and a backgate and other conduction terminal connected to receive said second potential.

3. A device for generating an intermediate potential between a first potential and a second potential, comprising:

first reference potential generating means coupled between a node receiving said first potential and a node receiving said second potential, for generating a first reference potential higher than said intermediate potential, said first reference potential generating means including insulated gate type field effect transistors of a first conductivity type connected in series to each other, and formed to have substantially the same voltage-current characteristics;

second reference potential generating means connected between the node receiving said first potential and the node receiving said second potential, for generating a second reference potential lower than said intermediate potential, said second reference potential generating means including insulated gate type field effect transistors of a second conductivity type formed to have substantially the same voltage-current characteristics, and connected in series to each other;

a first output driving insulated gate type field effect transistor connected between the node receiving said first potential and an output node, for transmitting said first reference potential to said output node in a source follower manner in which a potential at a source of an insulated gate field effect transistor is represented by a function of a potential at a gate thereof; and a second output driving insulated gate type field effect transistor connected between said output node and the node receiving said second potential, for transmitting said second reference potential to said output node in the source follower manner, wherein said first reference potential generating means is implemented on a substrate of triple-well structure.

4. A device for generating an intermediate potential between a first potential and a second potential, comprising:

first reference potential generating means coupled between a node receiving said first potential and a node receiving said second potential, for generating a first reference potential higher than said intermediate potential, said first reference potential generating means including insulated gate type field effect transistors of a first conductivity type connected in series to each other, and formed to have substantially the same voltage-current characteristics;

second reference potential generating means connected between the node receiving said first potential and the node receiving said second potential, for generating a second reference potential lower than said intermediate potential, said second reference potential generating means including insulated gate type field effect transistors of a second conductivity type formed to have substantially the same voltage-current characteristics, and connected in series to each other;

a first output driving insulated gate type field effect transistor connected between the node receiving said first potential and an output node, for transmitting said first reference potential to said output node in a source follower manner in which a potential at a source of an insulated gate field effect transistor is represented by a function of a potential at a gate thereof; and a second output driving insulated gate type field effect transistor connected between said output node and the node receiving said second potential, for transmitting said second reference potential to said output node in the source follower manner, wherein said second reference potential generating means includes
a first insulated gate type field effect transistor of the first conductivity type having a backgate and one conduction terminal connected to receive said first potential, and a gate and other conduction terminal connected to each other, a second insulated gate type field effect transistor of the second conductivity type connected between said first insulated gate type field effect transistor and an intermediate potential node, and having a backgate and one conduction terminal connected to each other, and a gate connected to a node different from the gate of said first insulated gate type field effect transistor, said second insulated gate type field effect transistor functioning as a first resistor, a third insulated gate type field effect transistor of the first conductivity type having a backgate and one conduction terminal connected to said intermediate potential node, and a gate and other conduction terminal connected to a gate of said second output driving field effect transistor, and having a threshold voltage smaller than the threshold voltage of said second output drive field effect transistor, and a fourth insulated gate type field effect transistor of the second conductivity type connected between the gate of said second output driving field effect transistor and the node receiving the second potential, and having a backgate and one conduction terminal connected to each other, and a gate connected to a node different from the gate of said third insulated gate type field effect transistor, said fourth insulated gate type field effect transistor functioning as a second resistor with a resistance value of said first resistor being the same as a resistance value of said second resistor.

5. A device for generating an intermediate potential between a first potential and a second potential, comprising:

first reference potential generating means coupled between a node receiving said first potential and a node receiving said second potential, for generating a first reference potential higher than said intermediate potential, said first reference potential generating means including insulated gate type field effect transistors of a first conductivity type connected in series to each other, and formed to have substantially the same voltage-current characteristics;

second reference potential generating means connected between the node receiving said first potential and the node receiving said second potential, for generating a second reference potential lower than said intermediate potential, said second reference potential generating means including insulated gate type field effect transistors of a second conductivity type formed to have substantially the same voltage-current characteristics, and connected in series to each other;

a first output driving insulated gate type field effect transistor connected between the node receiving said first potential and an output node, for transmitting said first reference potential to said output node in a source follower manner in which a potential at a source of an insulated gate field effect transistor is represented by a function of a potential at a gate thereof; and a second output driving insulated gate type field effect transistor connected between said output node and the node receiving said second potential, for transmitting said second reference potential to said output node in the source follower manner, wherein said second reference potential generating means includes
a first p-channel insulated gate type field effect transistor having a backgate and one conduction terminal connected to receive said first potential, and a gate and other conduction terminal connected to each other, a first n-channel insulated gate type field effect transistor having one conduction terminal connected to the other conduction terminal of said first p-channel insulated gate type field effect transistor, another conduction terminal connected to an intermediate potential node, and a gate connected to receive said first potential, a second p-channel insulated gate type field effect transistor having a backgate and one conduction terminal connected to said intermediate potential node, a gate and other conduction terminal connected to an internal node generating said second reference potential, and a second n-channel insulated gate type field effect transistor having one conduction terminal connected to said internal node, a backgate and other conduction terminal connected to receive said second potential, and a gate connected to said intermediate potential node.

6. A device for generating an intermediate potential between a first potential and a second potential, comprising:

first reference potential generating means coupled between a node receiving said first potential and a node receiving said second potential, for generating a first reference potential higher than said intermediate potential, said first reference potential generating means including insulated gate type field effect transistors of a first conductivity type connected in series to each other, and formed to have substantially the same voltage-current characteristics;

second reference potential generating means connected between the node receiving said first potential and the node receiving said second potential, for generating a second reference potential lower than said intermediate potential, said second reference potential generating means including insulated gate type field effect transistors of a second conductivity type formed to have substantially the same voltage-current characteristics, and connected in series to each other;

a first output driving insulated gate type field effect transistor connected between the node receiving said first potential and an output node, for transmitting said first reference potential to said output node in a source follower manner in which a potential at a source of an insulated gate field effect transistor is represented by a function of a potential at a gate thereof;

a second output driving insulated gate type field effect transistor connected between said output node and the node receiving said second potential, for transmitting said second reference potential to said output node in the source follower manner; and auxiliary drive means operatively coupled to said output node and responsive to the active level of a driving capability switching signal for providing increased current driving capability for driving said output node to said intermediate potential by a drive stage including said first and second output driving insulated gate type field effect transistors.

7. The device according to claim 6, wherein said auxiliary drive means includes
    a first switching transistor for transmitting said first potential to a drain of said first output driving insulated gate type field effect transistor in response to said driving capability switching signal being inactive,
    a current source transistor for supplying a current from the node receiving said first potential to said first output driving insulated gate type field effect transistor in response to said driving capability switching signal being inactive, and
    a charge supply element for supplying electric charges from a source of said first potential to said output node according to the current supplied by said current source transistor.

8. The device according to claim 6, wherein said auxiliary drive means includes
    a first insulated gate type field effect transistor connected between said first output driving insulated gate type field effect transistor and the node receiving said first potential, and being conductive in response to said driving capability switching signal being inactive at a first logic level,
    a second insulated gate type field effect transistor diode-connected between the node receiving said first potential and said first output driving insulated gate type field effect transistor in parallel with said first insulated gate type field effect transistor, and
    a third insulated gate type field effect transistor connected between the node receiving said first potential and said output node, and connected to said second insulated gate type field effect transistor in a current-mirror manner.

9. The device according to claim 6, wherein said auxiliary drive means includes
    a first switching transistor for transmitting said second potential to a drain of said second output driving insulated gate type field effect transistor in response to said driving capability switching signal being inactive at a first logic level,
    a current source transistor connected between the drain of said second output driving insulated gate type field effect transistor and the node receiving said second potential, for forming a current path to the node receiving said second potential from said second output driving insulated gate type field effect transistor in response to said driving capability switching signal being at a second logic level, and
    a current drive element for causing a current flow from said output node to the node receiving said second potential according to the current flowing through said current source transistor.

10. The device according to claim 6, wherein said auxiliary drive means includes
    a first insulated gate type field effect transistor connected between a drain of said second output driving insulated gate type field effect transistor and the node receiving said second potential, and being conductive in response to said driving capability switching signal being inactive,
    a second insulated gate type field effect transistor diode-connected and coupled between said second output driving insulated gate type field effect transistor and the node receiving said second potential in parallel with said first insulated gate type field effect transistor, and
    a third insulated gate type field effect transistor connected between said output node and the node receiving said second potential, so as to constitute a current-mirror circuit with said second insulated gate type field effect transistor.

11. The device according to claim 6, wherein said auxiliary drive means includes
    a p-channel insulated gate type field effect transistor having a threshold voltage smaller than the threshold voltage of said second output driving field effect transistor, and having a gate connected to receive said second reference potential, a conduction terminal connected to said output node, and other conduction terminal, a diode-connected insulated gate type field effect transistor connected between said other conduction terminal of said p-channel insulated gate type field effect transistor and the node receiving said second potential, and another insulated gate type field effect transistor connected between said output node and the node receiving said second potential, in a current-mirror manner with said diode-connected insulated gate type field effect transistor.

12. The device according to claim 11, wherein said p-channel insulated gate type field effect transistor has a backgate connected to receive said first potential.

13. The device according to claim 6, wherein said device is used in a dynamic type semiconductor memory device including a plurality of dynamic type memory cells arranged in rows and columns, a plurality of bit line pairs each connected to one column of the memory cells, and an internal data bus line to be connected to a selected bit line pair, and means coupled to receive an operation mode signal designating an operation mode of said dynamic type semiconductor memory device and responsive to said operation mode signal designating a standby mode of said dynamic type semiconductor memory device for transferring the intermediate potential received from said device onto each bit line of said bit line pairs and the internal data bus line for precharging thereof.

14. The device according to claim 6, wherein said device is used in a dynamic type semiconductor memory device including dynamic type memory cells each including a memory cell capacitor storing information and an access transistor for accessing said memory cell capacitor, said memory cell capacitor including a storage node connected to said access transistor, and a cell plate, and said intermediate potential is transmitted to said cell plate of said memory cell capacitor.

15. The device according to claim 6, wherein said device is used in a semiconductor memory device including means coupled to receive a power supply potential, for detecting application of the power supply to the semiconductor memory device in response to rise of the power supply potential to bring said driving capability switching signal into the active state for a prescribed period immediately after the application of the power supply to said semiconductor memory device, to activate said auxiliary drive means.

16. The device according to claim 6, wherein said device is used in a semiconductor memory device, and said driving capability switching signal is brought into the active state for a prescribed period, in response to transition of a memory access start instructing signal applied to said semiconductor memory device from activation to inactivation, to enable said auxiliary drive means.

17. A device for generating an intermediate potential between a first potential and a second potential, comprising:

first reference potential generating means coupled between a node receiving said first potential and a node receiving said second potential, for generating a first reference potential higher than said intermediate potential, said first reference potential generating means including insulated gate type field effect transistors of a first conductivity type connected in series to each other, and formed to have substantially the same voltage-current characteristics;

second reference potential generating means connected between the node receiving said first potential and the node receiving said second potential, for generating a second reference potential lower than said intermediate potential, said second reference potential generating means including insulated gate type field effect transistors of a second conductivity type formed to have substantially the same voltage-current characteristics, and connected in series to each other;

a first output driving insulated gate type field effect transistor connected between the node receiving said first potential and an output node, for transmitting said first reference potential to said output node in a source follower manner in which a potential at a source of an insulated gate field effect transistor is represented by a function of a potential at a gate thereof;

a second output driving insulated gate type field effect transistor connected between said output node and the node receiving said second potential, for transmitting said second reference potential to said output node in the source follower manner;

a first charge-supplying insulated gate type field effect transistor having a threshold voltage higher than the threshold voltage of said first output driving insulated gate type field effect transistor, for supplying electric charges to said output node according to the difference between said first reference potential and a potential of said output node;

a current-supplying insulated gate type field effect transistor for supplying a current from the node receiving said first potential to said first output driving insulated gate type field effect transistor; and a second charge-supplying insulated gate type field effect transistor for supplying electric charges to said output node according to the current flowing through said current-supplying insulated gate type effect transistor.

18. A device for generating an intermediate potential between a first potential and a second potential, comprising:

first reference potential generating means coupled between a node receiving said first potential and a node receiving said second potential, for generating a first reference potential higher than said intermediate potential, said first reference potential generating means including insulated gate type field effect transistors of a first conductivity type connected in series to each other, and formed to have substantially the same voltage-current characteristics;

second reference potential generating means connected between the node receiving said first potential and the node receiving said second potential, for generating a second reference potential lower than said intermediate potential, said second reference potential generating means including insulated gate type field effect transistors of a second conductivity type formed to have substantially the same voltage-current characteristics, and connected in series to each other;

a first output driving insulated gate type field effect transistor connected between the node receiving said first potential and an output node, for transmitting said first reference potential to said output node in a source follower manner in which a potential at a source of an insulated gate field effect transistor is represented by a function of a potential at a gate thereof;

a second output driving insulated gate type field effect transistor connected between said output node and the node receiving said second potential, for transmitting said second reference potential to said output node in the source follower manner;

a first n-channel insulated gate type field effect transistor having a gate receiving said first reference potential, one conduction terminal connected to said output node, other conduction terminal, and a backgate connected to receive second potential;

a diode-connected insulated gate type field effect transistor connected between the node receiving said first potential and said other conduction terminal of said first n-channel insulated gate type field effect transistor; and another insulated gate type field effect transistor connected to said diode-connected insulated gate type field effect transistor in a current-mirror manner, for supplying electric charges to said output node.

19. A device for generating an intermediate potential between a first potential and a second potential, comprising:

first reference potential generating means coupled between a node receiving said first potential and a node receiving said second potential, for generating a first reference potential higher than said intermediate potential, said first reference potential generating means including insulated gate type field effect transistors of a first conductivity type connected in series to each other, and formed to have substantially the same voltage-current characteristics;

second reference potential generating means connected between the node receiving said first potential and the node receiving said second potential, for generating a second reference potential lower than said intermediate potential, said second reference potential generating means including insulated gate type field effect transistors of a second conductivity type formed to have substantially the same voltage-current characteristics, and connected in series to each other;

a first output driving insulated gate type field effect transistor connected between the node receiving said first potential and an output node, for transmitting said first reference potential to said output node in a source follower manner in which a potential at a source of an insulated gate field effect transistor is represented by a function of a potential at a gate thereof;

a second output driving insulated gate type field effect transistor connected between said output node and the node receiving said second potential, for transmitting said second reference potential to said output node in the source follower manner; and auxiliary drive means operatively coupled to said output node and responsive to the active level of a driving capability switching signal for providing increased current driving capability for driving said output node to said intermediate potential by a drive stage including said first and second output driving insulated gate type field effect transistors, wherein, said auxiliary drive means includes a potential detecting insulated gate type field effect transistor being conductive when the difference between said second reference potential and a potential of said output node is not less than a prescribed value, a current source element for causing a current flow from said output node through said potential detecting transistor to the second potential node in response to said potential detecting insulated gate type field effect transistor being conductive, and a current extraction element for causing a current flow from said output node to the second potential according to the current flowing through said current source element.

20. A device comprising:

reference potential generating means for generating a first reference potential and a second reference potential which is lower than said first reference potential;

driving means, coupled to receive said first and second reference potentials, for driving an output node to an intermediate potential between said first and second reference potentials in accordance with the received first and second reference potentials; and auxiliary driving means responsive to a driving capability switching signal for enhancing a current driving capability of said driving means, said auxiliary driving means being coupled between a power supply source and said driving means for causing an increased current flow through said driving means in response to said driving capability switching signal being active to designate an enhancement of the current driving capability.

21. The device of claim 20, wherein said driving means comprises a first output driving transistor for driving said output node in accordance with said first reference potential, and a second output driving transistor for driving said output node in accordance with said second reference potential, and wherein said auxiliary driving means includes a first switching transistor coupled to a first line which supplies a first potential higher than said first reference potential, and said first switching transistor serving as a current source to said first output driving transistor in response to said driving capability switching signal being inactive, a current source transistor for supplying a current from said first line to said first output driving transistor in response to said driving capability switching signal being active, and a charge supply element for supplying a current to said output node from said first line in accordance with said current from said current source transistor.

22. The device of claim 20, wherein said driving means comprises a first output drive insulated gate type field effect transistor having a gate to receive said first reference potential and a conduction electrode coupled to said output node, and a second output drive insulated gate type field effect transistor having a gate to receive said second reference potential and a conduction electrode coupled to said output node, and wherein said auxiliary driving means comprises a first insulated gate type field effect transistor connected between said first output drive insulated gate type field effect transistor and a first line, which supplies a first potential higher than said first reference potential, and said first insulated gate type field effect transistor being conductive when said driving capability switching signal is at a first logic level, a second insulated gate type field effect transistor diode-connected in parallel with said first insulated gate type field effect transistor between the first line supplying said first potential and said first output driving insulated gate type field effect transistor, and a third insulated gate type field effect transistor connected between said first line and said output node, and connected to said second insulated gate type field effect transistor in a current-mirror manner.

23. The device of claim 20, wherein said driving means comprises a first output driving field effect transistor having a gate coupled to receive said first reference potential and a conduction electrode coupled to said output node, and a second output driving field effect transistor having a gate receiving said second reference potential and a conduction electrode coupled to said output node, and wherein said auxiliary drive means includes a first switching transistor supplying a second potential lower than said second reference potential to another conduction electrode of said second output driving field effect transistor when said driving capability switching signal is at a first logic level, a current source transistor connected between another conduction electrode of said second output driving field effect transistor and a first line which supplies said second potential, and said current source transistor forming a current path to the first line from said second output driving field effect transistor when said driving capability switching signal is at a second logic level, and a current drive element for causing a current to flow from said output node to the first line according to the current flowing through said current source transistor.

24. The device of claim 20, wherein said driving means comprises a first output driving field effect transistor having a gate to receive said first reference potential and a conduction electrode coupled to said output node, and a second output driving field effect transistor having a gate to receive said second reference potential and a conduction electrode coupled to said output node, and wherein said auxiliary driving means includes a first insulated gate type field effect transistor connected between another conduction electrode of said second output driving field effect transistor and a line which supplies a first potential lower than said second reference potential, and said first insulated gate type field effect transistor being conductive in response to said driving capability switching signal being inactive, a second insulated gate type field effect transistor diode-connected and coupled between said second output driving field effect transistor and the line which supplies said first potential in parallel with said first insulated gate type field effect transistor, and a third insulated gate type field effect transistor connected between said output node and the line which supplies said first potential, so as to constitute a current-mirror circuit with said second insulated gate type field effect transistor.

25. The device according to claim 20, wherein said device is used in a semiconductor memory device, and said driving capability switching signal is brought into the active state for a prescribed period immediately after application of power supply to said semiconductor memory device, to activate said auxiliary drive means.

26. The device according to claim 20, wherein said device is used in a semiconductor memory device, and said driving capability switching signal is brought into the active state for a prescribed period, in response to transition of a memory access start instructing signal applied to said semiconductor memory device from activation to inactivation, to enable said auxiliary drive means.

27. A device comprising:

reference potential generating means for generating a first reference potential and a second reference potential which is lower than said first reference potential;

driving means, coupled to receive said first and second reference potentials, and coupled between a power supply source and an output node for driving the output node to an intermediate potential between said first and second reference potentials in accordance with the received first and second reference potentials; and auxiliary driving means coupled between said power supply source and said output node in parallel with said driving means, for driving said output node to said intermediate potential when an absolute value of the difference between a potential appearing on said output node and said intermediate potential is larger than a prescribed value, to compensate for a current driving capability of said driving means.

28. A device for generating an intermediate potential between a first potential and a second potential, comprising:

a first reference potential generating means coupled between a node receiving said first potential and a node receiving said second potential for generating a first reference potential higher than said intermediate potential;

a second reference potential generating means coupled between the node receiving said first potential and the node receiving said second potential for generating a second reference potential lower than said intermediate potential;

a first output driving insulated gate type FET coupled between the node receiving the first potential and an output node, for transmitting said first reference potential to said output node in a source follower manner in which a potential at a source of an insulated gate field effect transistor is represented by a function of a potential at a gate thereof; and a second output driving insulated gate type FET coupled between the output node and the node receiving the second potential, for transmitting said second reference potential to said output node, said first reference potential generating means including a first resistance load coupled between the node receiving said first potential and the gate of the first output driving FET, a first FET of an n-channel type coupled between a first intermediate potential node and the gate of said first output driving FET, and having one conduction terminal and a gate coupled to the gate of the first output driving FET, and other conduction terminal and a backgate coupled to said first intermediate potential node, a second resistance load coupled between said intermediate potential node and an internal node, and a second FET of the n-channel type having one conduction terminal and a gate coupled to said internal node, and a backgate and other conduction terminal coupled to the node receiving said second potential, said second reference potential generating means including a third FET of a p-channel type having a backgate and one conduction terminal coupled to receive said first potential, and a gate and other conduction terminal coupled to a second internal node, a third resistance load coupled between said second internal node and a second intermediate potential node, a fourth FET of the p-channel type having a backgate and one conduction terminal coupled to said second intermediate potential node, and a gate and other conduction terminal coupled to a gate of said second output driving field effect transistor, and a fourth resistance load coupled between the gate of said second output driving field effect transistor and the node receiving the second potential, wherein said first and second resistance loads have a first resistance, and the third and fourth resistance loads have a second resistance.

* * * * *